US011424306B2

(12) United States Patent
Jeon et al.

(10) Patent No.: US 11,424,306 B2
(45) Date of Patent: Aug. 23, 2022

(54) DISPLAY DEVICE AND METHOD OF MANUFACTURING THE SAME

(71) Applicant: Samsung Display Co., Ltd., Yongin-si (KR)

(72) Inventors: Woosik Jeon, Yongin-si (KR); Eonseok Oh, Yongin-si (KR); Sangyeol Kim, Yongin-si (KR); Hanggochnuri Jo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 97 days.

(21) Appl. No.: 16/818,759

(22) Filed: Mar. 13, 2020

(65) Prior Publication Data

US 2020/0365664 A1    Nov. 19, 2020

(30) Foreign Application Priority Data

May 13, 2019    (KR) .................. 10-2019-0055838

(51) Int. Cl.
*H01L 27/32* (2006.01)
*H01L 51/00* (2006.01)
(Continued)

(52) U.S. Cl.
CPC ........ *H01L 27/326* (2013.01); *H01L 51/0027* (2013.01); *H01L 51/5253* (2013.01); *H01L 51/56* (2013.01)

(58) Field of Classification Search
CPC . H01L 51/0027; H01L 51/5253; H01L 51/56; H01L 27/326
See application file for complete search history.

(56) References Cited

U.S. PATENT DOCUMENTS 6,861,008 B1    3/2005 De Steur et al.
7,514,326 B2    4/2009 Han
(Continued)

FOREIGN PATENT DOCUMENTS

EP    3 046 157 A1    7/2016
EP    3 139 422 A2    3/2017
(Continued)

OTHER PUBLICATIONS

Gecys, Paulius, et al., "Ultrashort pulsed laser induced material lift-off processing of CZTSe thin-film solar cells," Science Direct, Solar Energy, 102 (2014), pp. 82-90.
(Continued)

*Primary Examiner* — Shaun M Campbell
(74) *Attorney, Agent, or Firm* — Lewis Roca Rothgerber Christie LLP

(57) ABSTRACT

A display device includes a substrate including a first display area and a second display area, the first display area including a first pixel, and the second display area including a second pixel and a transmissive area, a first pixel electrode and a first emission layer in the first pixel, a second pixel electrode and a second emission layer in the second pixel, an opposite electrode arranged as one body in the first display area and the second display area, and a top layer arranged on the opposite electrode, wherein the opposite electrode and the top layer each have an opening area corresponding to the transmissive area, and wherein a convex portion is around the transmissive area, the convex portion being convex in a top surface direction of the substrate.

15 Claims, 20 Drawing Sheets

(51) Int. Cl.
*H01L 51/52* (2006.01)
*H01L 51/56* (2006.01)

(56) References Cited

U.S. PATENT DOCUMENTS

| | | | |
|---|---|---|---|
| 8,045,084 B2 | 10/2011 | Baek et al. | |
| 8,466,466 B2 * | 6/2013 | Ha | H01L 51/5056 257/59 |
| 9,437,623 B2 | 9/2016 | Hosoya | |
| 9,640,594 B2 * | 5/2017 | Oh | H01L 27/3232 |
| 9,786,732 B2 | 10/2017 | Jeon et al. | |
| 2011/0207254 A1 | 8/2011 | Lee | |
| 2011/0220901 A1 * | 9/2011 | Ha | H01L 27/3276 257/59 |
| 2012/0001184 A1 * | 1/2012 | Ha | H01L 27/3279 257/59 |
| 2016/0126494 A1 | 5/2016 | Jung et al. | |
| 2017/0069871 A1 * | 3/2017 | Yim | H01L 27/3258 |

FOREIGN PATENT DOCUMENTS

| | | |
|---|---|---|
| EP | 3 428 967 A1 | 1/2019 |
| KR | 10-0752831 B1 | 8/2007 |
| KR | 10-1169079 B1 | 7/2012 |
| KR | 10-1209809 B1 | 12/2012 |
| KR | 10-1324152 B1 | 11/2013 |
| KR | 10-2015-0002341 A | 1/2015 |
| KR | 10-2017-0047473 A | 5/2017 |

OTHER PUBLICATIONS

Maniscalco, B., et al., "Thin film thickness measurements using Scanning White Light Interferometry," Thin Solid Films 550 (2014), pp. 10-16.

Ho, Wen-Jeng, et al., "Electrical and Optical Characterization of Sputtered Silicon Dioxide, Indium Tin Oxide, and Silicon Dioxide/Indium Tin Oxide Antireflection Coating on Single-Junction GaAs Solar Cells," Materials 2017, 10(7), 700, 9 pp.

* cited by examiner

DISPLAY DEVICE AND METHOD OF MANUFACTURING THE SAME

CROSS-REFERENCE TO RELATED APPLICATION

This application claims priority to and the benefit of Korean Patent Application No. 10-2019-0055838, filed on May 13, 2019, in the Korean Intellectual Property Office, the disclosure of which is incorporated herein in its entirety by reference.

BACKGROUND

1. Field

Aspects of the present disclosure relate to a display device.

2. Description of the Related Art

Recently, use purposes of display devices have become more diversified. For example, as display devices have become thinner and more lightweight, their range of use has gradually been extended. Additionally, functions that may be combined or associated with a display device are increasing over time.

As a display device may be used in different ways, there may be various methods in designing the shape of a display device.

SUMMARY

Aspects of some embodiments are directed to a display device including a second display area inside a first display area, a sensor, etc. being arranged in the second display area. However, it should be understood that embodiments described herein should be considered in a descriptive sense only and not for limitation of the disclosure.

Additional aspects will be set forth in part in the description which follows and, in part, will be apparent from the description, or may be learned by practice of the presented embodiments.

According to some embodiments, there is provided a display device including: a substrate including a first display area and a second display area, the first display area including a first pixel, and the second display area including a second pixel and a transmissive area; a first pixel electrode and a first emission layer in the first pixel; a second pixel electrode and a second emission layer in the second pixel; an opposite electrode arranged as one body in the first display area and the second display area; and a top layer arranged on the opposite electrode, wherein the opposite electrode and the top layer each have an opening area corresponding to the transmissive area, and wherein a convex portion is around the transmissive area, the convex portion being convex in a top surface direction of the substrate.

In some embodiments, the convex portion is a portion of the top layer.

In some embodiments, the display device further including: an organic functional layer between the first pixel electrode and the opposite electrode, wherein the organic functional layer corresponds to the transmissive area.

In some embodiments, a plurality of protrusion patterns are on a top surface of the organic functional layer.

In some embodiments, the plurality of protrusion patterns are apart from each other at set intervals, each of the plurality of protrusion patterns extending in one direction.

In some embodiments, the display device further includes: a second thin film transistor in the second display area; and a bottom electrode layer between the substrate and the second thin film transistor.

In some embodiments, the display device further includes: a pixel-defining layer exposing a central portion of each of the first pixel electrode and the second pixel electrode and covering edges of each of the first pixel electrode and the second pixel electrode, wherein the pixel-defining layer includes a first opening corresponding to the transmissive area.

In some embodiments, the display device further includes: a planarization layer between the substrate and the pixel-defining layer, wherein the planarization layer includes a second opening corresponding to the transmissive area.

In some embodiments, a width of the first opening is less than a width of the second opening.

In some embodiments, the display device further includes: an inorganic insulating layer arranged on the substrate, wherein the inorganic insulating layer includes a third opening corresponding to the transmissive area.

In some embodiments, a width of the opening area is less than a width of the third opening.

In some embodiments, the first display area and the second display area are sealed by an encapsulation substrate facing the substrate.

In some embodiments, the display device further includes: a thin-film encapsulation layer including a first inorganic encapsulation layer, an organic encapsulation layer, and a second inorganic encapsulation layer that are sequentially stacked on the top layer.

According to some embodiments, there is provided a display device including: a substrate including a pixel and a transmissive area, the pixel including a display element; a pixel electrode and an emission layer in the pixel; an opposite electrode on the emission layer; and a top layer on the opposite electrode, wherein the opposite electrode and the top layer each have an opening corresponding to the transmissive area, and wherein the top layer includes a convex portion, the convex portion neighboring the transmissive area and being thicker than a thickness of surroundings thereof.

In some embodiments, the display device further includes: an organic functional layer between the pixel electrode and the opposite electrode, wherein the organic functional layer corresponds to the transmissive area.

In some embodiments, a plurality of protrusion patterns are on a top surface of the organic functional layer.

According to some embodiments, there is provided a method of manufacturing a display device including a substrate including a first display area and a second display area, the first display area including a first pixel, and the second display area including a second pixel and a transmissive area, the method including: forming an opposite electrode and a top layer in the first display area and the second display area over a top surface of the substrate; irradiating laser light to an area of the opposite electrode that corresponds to the transmissive area from a backside of the substrate, the laser light having an infrared wavelength; and forming an opening area in the opposite electrode and the top layer by lifting off the area of the opposite electrode to which the laser light is irradiated from the substrate.

In some embodiments, the top layer includes a convex portion around the transmissive area, the convex portion being formed by the laser light.

In some embodiments, a wavelength of the laser light is about 1000 nm to about 1100 nm.

In some embodiments, an absorption rate of layers arranged from the substrate to the opposite electrode with respect to the laser light is 20% or less.

In some embodiments, the method further includes: providing an organic function layer corresponding to the transmissive area, wherein the organic functional layer includes a protrusion pattern formed by the laser light.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
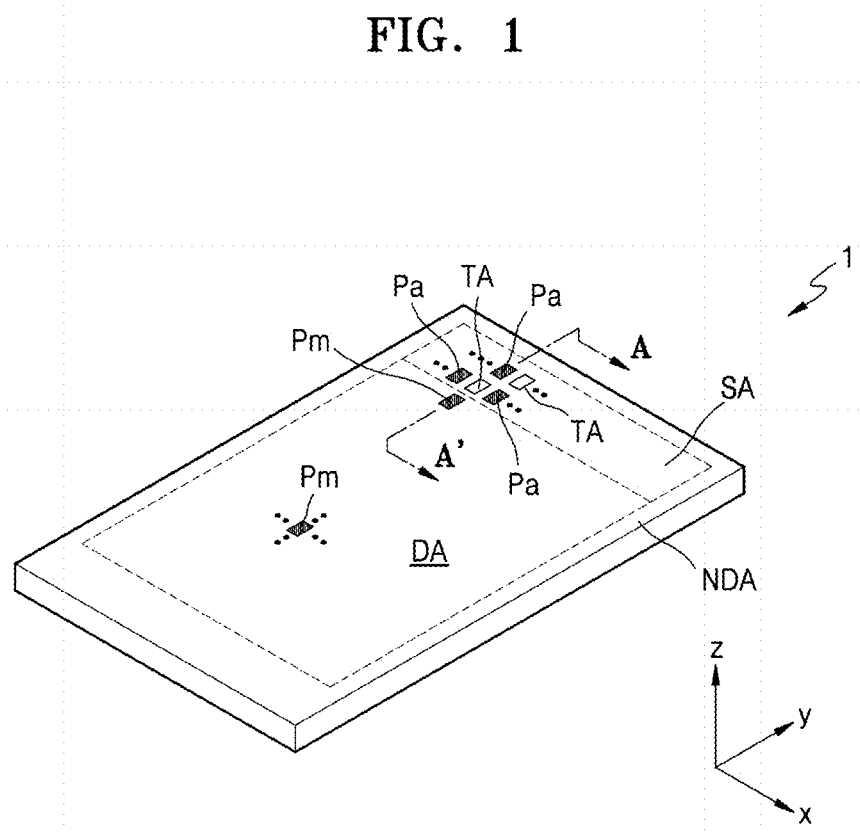
FIG. 1 is a perspective view of a display device according to an example embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

As the disclosure allows for various changes and numerous embodiments, example embodiments will be illustrated in the drawings and described in detail in the written description. An effect and a characteristic of the disclosure, and a method of accomplishing these will be apparent when referring to embodiments described with reference to the drawings. This disclosure may, however, be embodied in many different forms and should not be construed as limited to the example embodiments set forth herein.

Hereinafter, the disclosure will be described more fully with reference to the accompanying drawings, in which example embodiments of the disclosure are shown. When description is made with reference to the drawings, like reference numerals in the drawings denote like or corresponding elements, and repeated descriptions thereof may be omitted.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

FIG. 1 is a perspective view of a display device 1 according to an embodiment.

Referring to FIG. 1, the display device 1 includes a first display area DA that displays an image and a first non-display area NDA that does not display an image. The display device 1 may display an image by using light emitted from a plurality of first pixels Pm arranged in the first display area DA.

The display device 1 includes a second display area SA. As described below with reference to FIG. 2, the second display area SA may include an area in which a component such as a sensor that uses infrared light, visible light, or sound is arranged in a lower portion thereof. The second display area SA may include a transmissive area TA that may transmit light and/or sound that is output from the component to the outside or progresses toward the component from the outside. In an embodiment, in the case where infrared light passes through the second display area SA, a light transmittance may be 30% or more, more preferably 50% or more, 75% or more, 80% or more, 85% or more, or 90% or more.

In the present embodiment, a plurality of second pixels Pa may be arranged in the second display area SA. The display device may display a set or predetermined image by using light emitted from the second pixels Pa. An image displayed on the second display area SA is an auxiliary image and may have a resolution less than that of an image displayed on the first display area DA. That is, since the second display area SA includes the transmissive area TA that may transmit light and/or sound, the number of second pixels Pa that may be arranged per unit area may be less than the number of first pixels Pm that may be arranged per unit area in the first display area DA.

The second display area SA may be arranged on one side of the first display area DA. In an embodiment, FIG. 1 shows that the second display area SA is arranged on the first display area DA, the second display area SA being arranged between the first non-display area NDA and the first display area DA. However, embodiments are not limited thereto. For example, the second display area SA may be surrounded by the first display area DA. Various suitable modifications may be made.

Though a display device according to an embodiment is described as an organic light-emitting display device as an example, a display device according to the present disclosure is not limited thereto. In another embodiment, various suitable display devices such as an inorganic light-emitting display apparatus and a quantum dot light-emitting display apparatus may be used.

Though it is shown in FIG. 1 that the second display area SA is arranged on the first display area DA, which has a quadrangular shape, embodiments are not limited thereto. For example, the shape of the first display area DA may include a circle, an ellipse, or a polygon such as a triangle or a pentagon. The location and the number of second display areas SA may be variously changed in a suitable manner.

Figure 2:
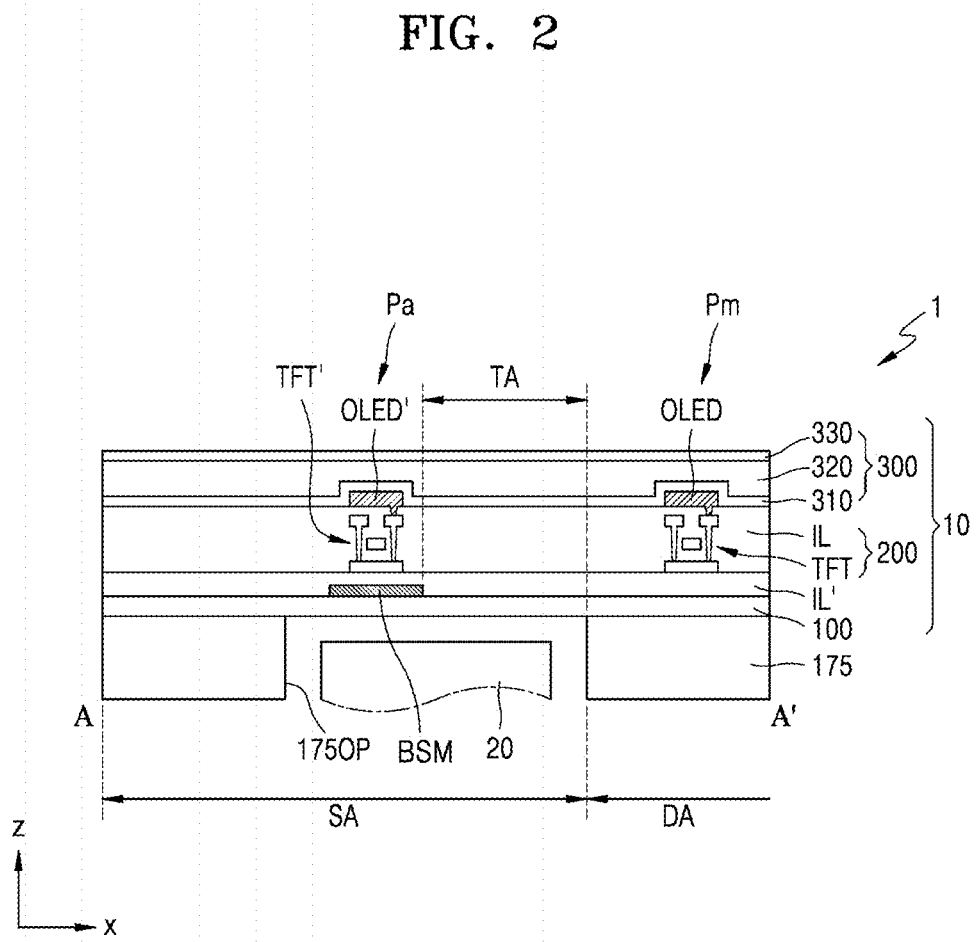
FIG. 2 is a cross-sectional view of a display device according to some example embodiments.

FIG. 2 is a cross-sectional view of a display device according to embodiments and may correspond to a cross-section taken along line A-A' of FIG. 1.

Referring to FIG. 2, the display device 1 may include a display panel 10 including a display element, and a component 20 corresponding to the second display area SA.

The display panel 10 may include a substrate 100, a display element layer 200, and a thin-film encapsulation layer 300, the display element layer 200 being arranged over the substrate 100, and the thin-film encapsulation layer 300 sealing the display element layer 200 as a sealing member. Also, the display panel 10 may further include a lower protective film 175 arranged under the substrate 100.

The substrate 100 may include glass or a polymer resin. The polymer resin may include polyethersulfone (PES), polyacrylate, polyetherimide (PEI), polyethylene naphthalate (PEN), polyethylene terephthalate (PET), polyphenylene sulfide (PPS), polyarylate, polyarylate, polyimide (PI), polycarbonate (PC), cellulose acetate propionate (CAP), and/or the like. The substrate 100 including the polymer resin may be flexible, rollable, or bendable. The substrate 100 may have a multi-layered structure including a layer including a polymer resin and an inorganic layer.

The display element layer 200 may include a circuit layer, an organic light-emitting diode OLED as a display element, and insulating layers IL and IL' therebetween, the circuit layer including thin film transistors TFT and TFT'.

A first pixel Pm may be arranged in the first display area DA, the first pixel Pm including a main thin film transistor TFT and an organic light-emitting diode OLED connected thereto. A second pixel Pa may be arranged in the second display area SA, the second pixel Pa including a second thin film transistor TFT' and an organic light-emitting diode OLED' connected thereto.

Also, a transmissive area TA may be arranged in the second display area SA, the second thin film transistor TFT' and a display element not being arranged in the transmissive area TA. It may be understood that the transmissive area TA is an area that transmits light/signal emitted from the component 20 or light/signal incident to the component 20.

The component 20 may be located in the second display area SA. The component 20 may include an electronic element that uses light or sound. For example, the component 20 may be a sensor such as an infrared sensor that emits and/or receives light, a sensor that outputs and senses light or sound to measure a distance or recognize a fingerprint, a small lamp that outputs light, or a speaker that outputs sound. An electronic element that uses light may use light in various suitable wavelength bands such as visible light, infrared light, and ultraviolet light. The component 20 arranged in the second display area SA may be provided as a plurality of components. For example, as the component 20, a light-emitting element and a light-receiving element may be provided together in the second display area SA. In some examples, a light emitter and a light receiver may both be (e.g., be simultaneously) provided to one component 20.

A bottom electrode layer BSM may be arranged in the second display area SA. The bottom electrode layer BSM may be arranged below the second thin film transistor TFT'. The bottom electrode layer BSM may prevent or substantially prevent external light from reaching the second pixel Pa including the second thin film transistor TFT'. For example, the bottom electrode layer BSM may prevent or substantially prevent light emitted from the component 20 from reaching the second pixel Pa.

In an embodiment, a constant voltage or a signal may be applied to the bottom electrode layer BSM to prevent or substantially prevent the pixel circuit from being damaged by electrostatic discharge.

The thin-film encapsulation layer 300 may include at least one inorganic encapsulation layer and at least one organic encapsulation layer. With regard to this, FIG. 2 shows a first inorganic encapsulation layer 310, a second inorganic encapsulation layer 330, and an organic encapsulation layer 320.

The first inorganic encapsulation layer 310 and the second inorganic encapsulation layer 330 may each include at least one of inorganic insulating materials including aluminum oxide, titanium oxide, tantalum oxide, hafnium oxide, zinc oxide, silicon oxide, silicon nitride, and silicon oxynitride. The organic encapsulation layer 320 may include a polymer-based material. The polymer-based material may include an acrylic-based resin, an epoxy-based resin, polyimide, polyethylene, and/or the like.

The lower protective film 175 may be attached on a backside of the substrate 100 to support and protect the substrate 100. The lower protective film 175 may include an opening 175OP corresponding to the second display area SA. Since the lower protective film 175 includes the opening 175OP, a light transmittance of the second display area SA may be improved. The lower protective film 175 may include PET or PI.

An area of the second display area SA may be greater than an area in which the component 20 is arranged. Therefore, an area of the opening 175OP of the lower protective film 175 may not coincide with the area of the second display area SA. For example, the area of the opening 175OP may be less than the area of the second display area SA.

Also, a plurality of components 20 may be arranged in the second display area SA. The plurality of components 20 may have different functions.

An input sensing member, a reflection prevention member, and a transparent window may be further arranged on the display panel 10, the input sensing member sensing a touch input, and the reflection prevention member including a polarizer and a retarder, or a color filter and a black matrix.

Although the illustrated embodiment shows that the thin-film encapsulation layer 300 is used as an encapsulation member sealing the display element layer 200, embodiments are not limited thereto. For example, as a member sealing the display element layer 200, a sealing substrate may be used, the sealing substrate being attached on the substrate 100 by sealant or frit.

Figure 3A:
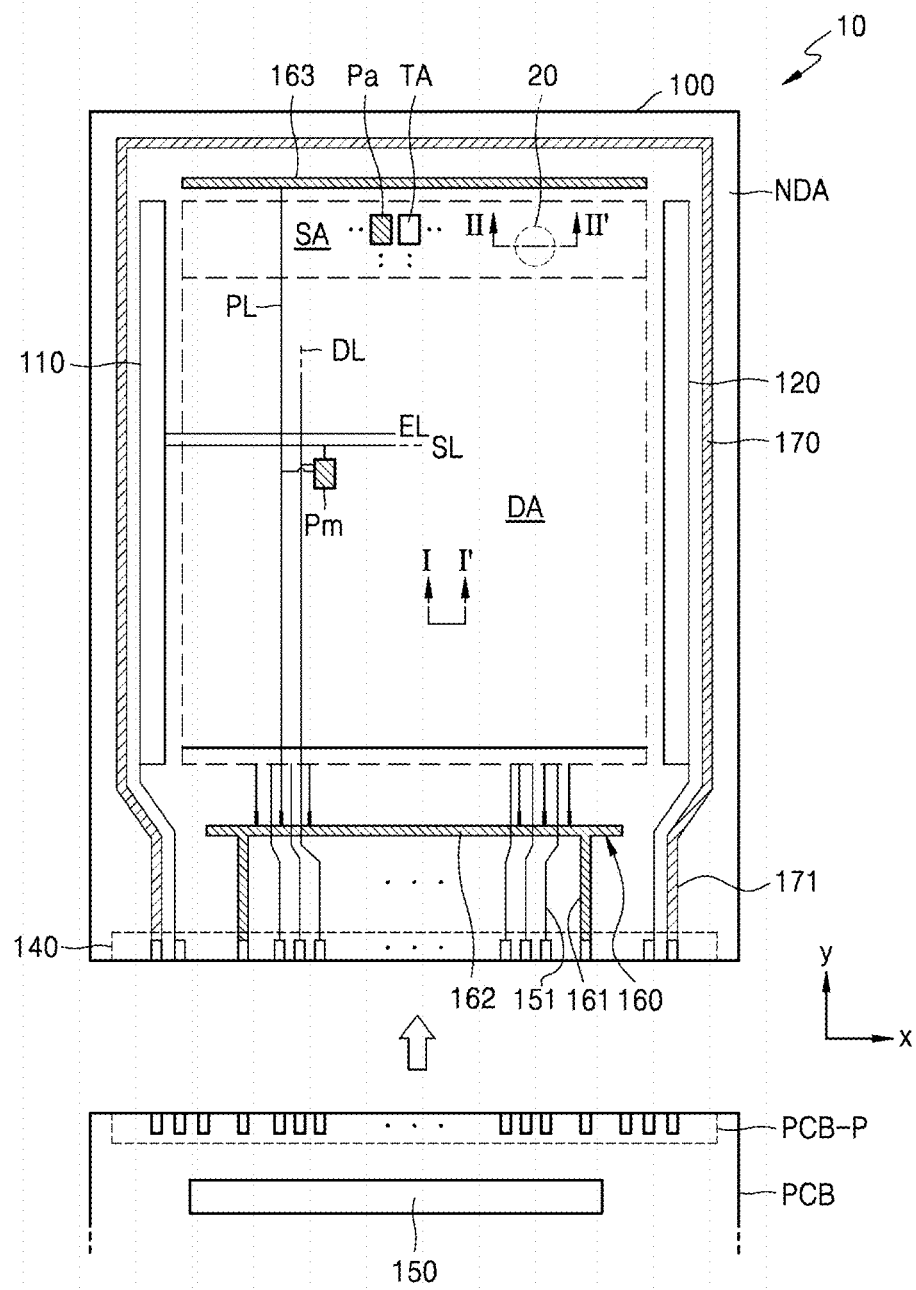
FIGS. 3A-3B are plan views of a display device according to an example embodiment.

FIG. 3A is a plan view of a display panel 10 according to an embodiment.

Referring to FIG. 3A, the display panel 10 is arranged in the first display area DA and includes a plurality of first pixels Pm. The first pixels Pm may each include a display element such as an organic light-emitting diode. Each first pixel Pm may emit, for example, red, green, blue, or white light through an organic light-emitting diode. In the present specification, it may be understood that the first pixel Pm is a sub-pixel that emits light of one of red, green, blue, and white colors as described above. The first display area DA may be covered by the encapsulation member described with reference to FIG. 2 and thus be protected from external air or moisture.

The second display area SA may be arranged on one side of the first display area DA. A plurality of second pixels Pa are arranged in the second display area SA. The second pixels Pa may each include a display element such as an organic light-emitting diode. Each second pixel Pa may emit, for example, red, green, blue, or white light through an organic light-emitting diode. In the present specification, it may be understood that the second pixel Pa is a sub-pixel that emits light of one of red, green, blue, and white colors as described above. The transmissive area TA may be arranged in the second display area SA, the transmissive area TA being arranged between the second pixels Pa. At least one component 20 may be arranged below the second display area SA of the display panel 10.

In an embodiment, a pixel circuit of the first pixel Pm may be the same as that of the second pixel Pa. However, embodiments are not limited thereto. For example, a pixel circuit included in the first pixel Pm may be different from a pixel circuit included in the second pixel Pa.

Since the second display area SA includes the transmissive area TA, a resolution of the second display area SA may be less than that of the first display area DA. For example, the resolution of the second display area SA may be about ½ of the resolution of the first display area DA. In an embodiment, the resolution of the first display area DA may be 400 ppi or more, and the resolution of the second display area SA may be 200 ppi or more.

Each of the first and second pixels Pm and Pa may be electrically connected to peripheral circuits arranged in the first non-display area NDA. A first scan driving circuit 110, a second scan driving circuit 120, a terminal 140, a data driving circuit 150, a first power supply line 160, and a second power supply line 170 may be arranged in the first non-display area NDA.

The first scan driving circuit 110 may provide a scan signal to each of the first and second pixels Pm and Pa through the scan line SL. The first scan driving circuit 110 may provide an emission control signal to each of the first and second pixels Pm and Pa through an emission control line EL. The second scan driving circuit 120 may be arranged in parallel to the first scan driving circuit 110 with the first display area DA therebetween. Some of the first pixels Pm arranged in the first display area DA may be electrically connected to the first scan driving circuit 110, and the rest of the first pixels Pm may be connected to the second scan driving circuit 120. In another embodiment, the second scan driving circuit 120 may be omitted.

The terminal 140 may be arranged on one side of the substrate 100. The terminal 140 may be exposed by not being covered by an insulating layer and thus electrically connected to a printed circuit board PCB. A terminal PCB-P of the printed circuit board PCB may be electrically connected to the terminal 140 of the display panel 10. The printed circuit board PCB transfers a signal or power of a controller to the display panel 10. A control signal generated by the controller may be transferred to each of the first scan driving circuit 110 and the second scan driving circuit 120 through the printed circuit board PCB. The controller may provide a first power voltage ELVDD and a second power voltage ELVSS (see FIGS. 4A and 4B which will be described below), to the first power supply line 160 and the second power supply line 170, respectively, through a first connection line 161 and a second connection line 171. The first power voltage ELVDD may be provided to each of the first pixel Pm and the second pixel Pa through a driving voltage line PL connected to the first power supply line 160, and the second power voltage ELVSS (also referred to as a common voltage) may be provided to an opposite electrode of each of the first pixel Pm and the second pixel Pa connected to the second power supply line 170.

A data driving circuit 150 is electrically connected to a data line DL. A data signal of the data driving circuit 150 may be provided to each of the first pixel Pm and the second pixel Pa through a connection line 151 connected to the terminal 140 and the data line DL connected to the connection line 151. Though it is shown in FIG. 3 that the data driving circuit 150 is arranged on the printed circuit board PCB, the data driving circuit 150 may instead be arranged on the substrate 100. For example, the data driving circuit 150 may be arranged between the terminal 140 and the first power supply line 160.

The first power supply line 160 may include a first sub-line 162 and a second sub-line 163, the first sub-line 162 and the second sub-line 163 extending in parallel to each other in an x-direction with the first display area DA therebetween. The second power supply line 170 has a loop shape having one open side and may partially surround the first display area DA.

Figure 3B:
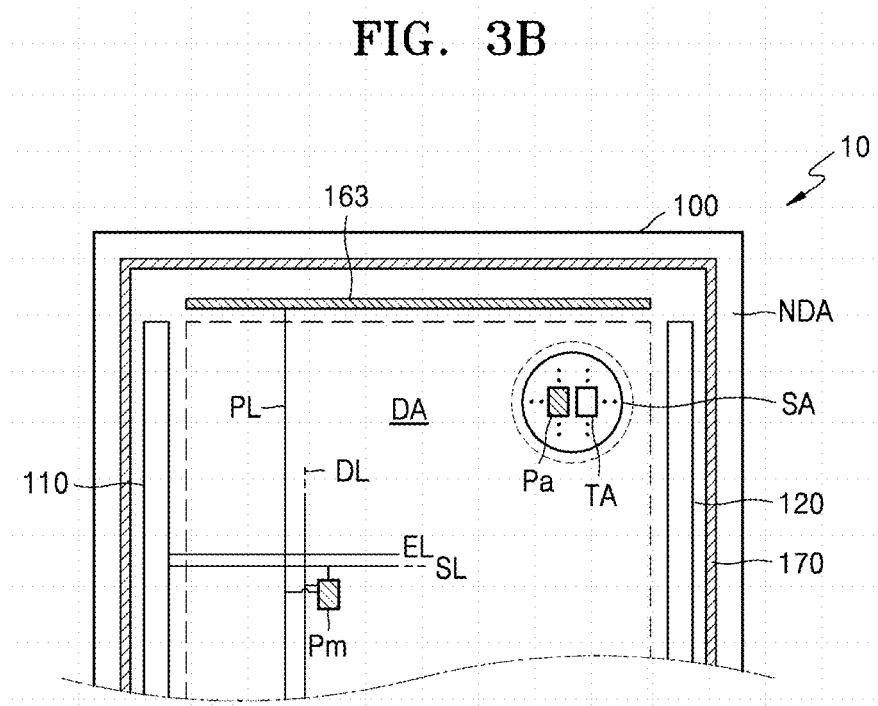

Though it is shown in FIG. 3A that the second display area SA is arranged on one side of the first display area DA, embodiments are not limited thereto. For example, as shown in FIG. 3B, the second display area SA may be provided as an area corresponding to a sensor arranged therebelow. In this case, the second display area SA may be arranged inside the first display area DA and thus surrounded by the first display area DA.

Figure 4A:
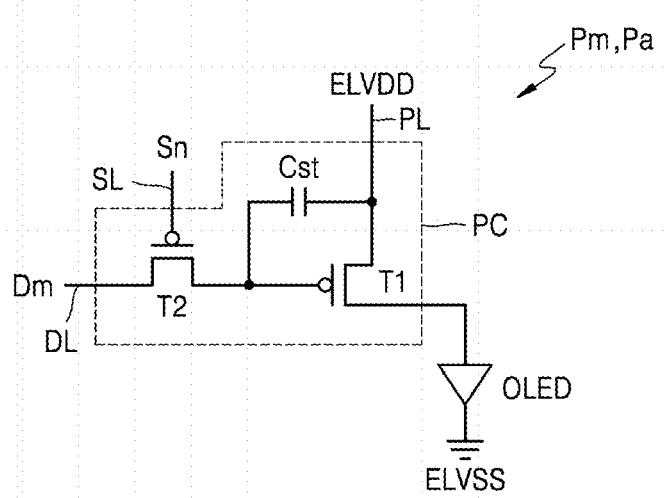
FIG. 4A is an equivalent circuit diagram of a pixel that may be arranged in a display area and/or a second display area of a display device according to an example embodiment.
Figure 4B:
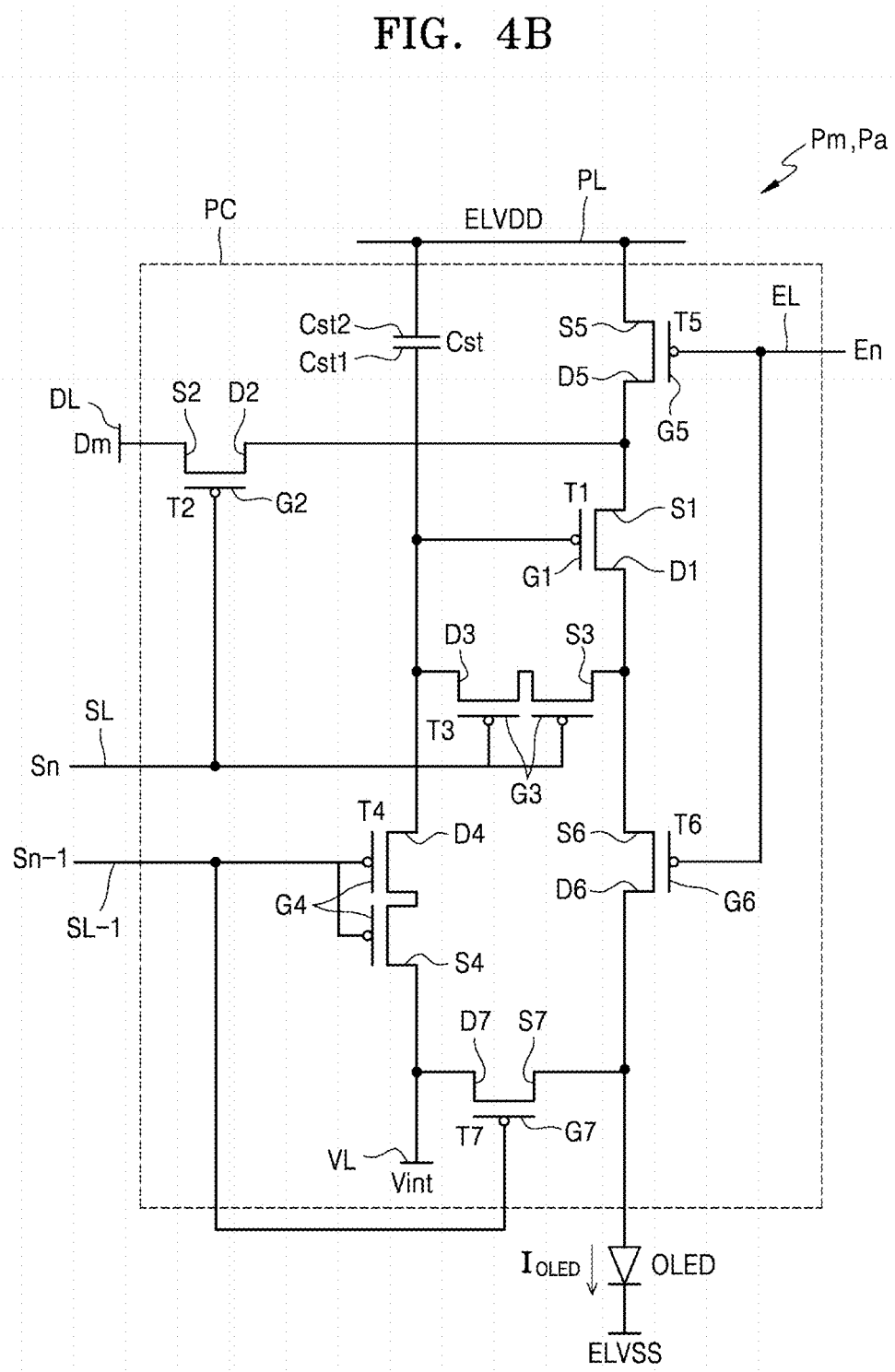
FIG. 4B is an equivalent circuit diagram of a pixel that may be arranged in a display area and/or a second display area of a display device according to another example embodiment.

FIGS. 4A and 4B are equivalent circuit diagrams of a first pixel and/or a second pixel that may be included in a display panel according to an embodiment.

Referring to FIG. 4A, each of the first and second pixels Pm and Pa includes a pixel circuit and an organic light-emitting diode OLED, the pixel circuit being connected to a scan line SL and a data line DL, and the organic light-emitting diode OLED being connected to the pixel circuit PC.

The pixel circuit PC includes a driving thin film transistor T1, a switching thin film transistor T2, and a storage capacitor Cst. The switching thin film transistor T2 is connected to the scan line SL and the data line DL and transfers a data signal Dm to the driving thin film transistor T1 in response to a scan signal Sn input through the scan line SL, the data signal Dm being input through the data line DL.

The storage capacitor Cst is connected to the switching thin film transistor T2 and the driving voltage line PL and stores a voltage corresponding to a difference between a voltage transferred from the switching thin film transistor T2 and the first power voltage ELVDD (or a driving voltage) supplied through the driving voltage line PL.

The driving thin film transistor T1 may be connected to the driving voltage line PL and the storage capacitor Cst and may control a driving current flowing through the organic light-emitting diode OLED from the driving voltage line PL in response to a voltage stored in the storage capacitor Cst. The organic light-emitting diode OLED may emit light having a set or predetermined brightness by using the driving current.

Though FIG. 4A describes the case where the pixel circuit PC includes two thin film transistors and one storage capacitor, embodiment are not limited thereto. For example, as shown in FIG. 4B, the pixel circuit PC may include seven thin film transistors and one storage capacitor.

Referring to FIG. 4B, each of the first and second pixels Pm and Pa includes the pixel circuit PC and the organic light-emitting diode OLED connected to the pixel circuit PC. The pixel circuit PC may include a plurality of thin film transistors and a plurality of storage capacitors. The thin film transistors and the storage capacitor may be connected to signal lines SL, SL-1, EL, and DL, an initialization voltage line VL, and the driving voltage line PL.

Though it is shown in FIG. 4B that each of the first and second pixels Pm and Pa is connected to the signal lines SL, SL-1, EL, and DL, the initialization voltage line VL, and the driving voltage line PL, embodiments are not limited thereto. In another embodiment, at least one of the signal lines SL, SL-1, EL, and DL, the initialization voltage line VL, and the driving voltage line PL may be shared by neighboring pixels.

The plurality of thin film transistors may include the driving thin film transistor T1, the switching thin film transistor T2, a compensation thin film transistor T3, a first initialization thin film transistor T4, an operation control thin film transistor T5, an emission control thin film transistor T6, and a second initialization thin film transistor T7.

The signal lines include the scan line SL, a previous scan line SL-1, an emission control line EL, and the data line DL. The scan line SL transfers a scan signal Sn, the previous scan line SL-1 transfers a previous scan signal Sn-1 to the first initialization thin film transistor T4 and the second initialization thin film transistor T7, the emission control line EL transfers an emission control signal En to the operation control thin film transistor T5 and the emission control thin film transistor T6, and the data line DL crossing the scan line SL and transfers a data signal Dm. The driving voltage line PL transfers the driving voltage ELVDD to the driving thin film transistor T1, and the initialization voltage line VL transfers an initialization voltage Vint that initializes the driving thin film transistor T1 and the pixel electrode.

A driving gate electrode G1 of the driving thin film transistor T1 is connected to a first electrode Cst1 of the storage capacitor Cst, a driving source electrode S1 of the driving thin film transistor T1 is connected to the driving voltage line PL through the operation control thin film transistor T5, and a driving drain electrode D1 of the driving thin film transistor T1 is electrically connected to the pixel electrode of a main organic light-emitting diode OLED through the emission control thin film transistor T6. The driving thin film transistor T1 receives a data signal Dm according to a switching operation of the switching thin film transistor T2 and supplies a driving current $I_{OLED}$ to the main organic light-emitting diode OLED.

A switching gate electrode G2 of the switching thin film transistor T2 is connected to the scan line SL, a switching source electrode S2 of the switching thin film transistor T2 is connected to the data line DL, and a switching drain electrode D2 of the switching thin film transistor T2 is connected to the driving source electrode S1 of the driving thin film transistor T1 and simultaneously connected to the driving voltage line PL through the operation control thin film transistor T5. The switching thin film transistor T2 is turned on in response to a scan signal Sn transferred through the scan line SL and performs a switching operation of transferring a data signal Dm transferred through the data line DL to the driving source electrode S1 of the driving thin film transistor T1.

A compensation gate electrode G3 of the compensation thin film transistor T3 is connected to the scan line SL, a compensation source electrode S3 of the compensation thin film transistor T3 is connected to the driving drain electrode D1 of the driving thin film transistor T1 and simultaneously connected to the pixel electrode of the organic light-emitting diode OLED through the emission control thin film transistor T6, and a compensation drain electrode D3 of the compensation thin film transistor T3 is connected to the first electrode Cst1 of the storage capacitor Cst, a first initialization drain electrode D4 of the first initialization thin film transistor T4, and the driving gate electrode G1 of the driving thin film transistor T1. The compensation thin film transistor T3 is turned on in response to a scan signal Sn transferred through the scan line SL and diode-connects the driving thin film transistor T1 by electrically connecting the driving gate electrode G1 to the driving drain electrode D1 of the driving thin film transistor T1.

A first initialization gate electrode G4 of the first initialization thin film transistor T4 is connected to the previous scan line SL-1, a first initialization source electrode S4 of the first initialization thin film transistor T4 is connected to a second initialization drain electrode D7 of the second initialization thin film transistor T7 and the initialization voltage line VL, and a first initialization drain electrode D4 of the first initialization thin film transistor T4 is connected to the first electrode Cst1 of the storage capacitor Cst, the compensation drain electrode D3 of the compensation thin film transistor T3, and the driving gate electrode G1 of the driving thin film transistor T1. The first initialization thin film transistor T4 is turned on in response to a previous scan signal Sn-1 transferred through the previous scan line SL-1 and performs an initialization operation of transferring an initialization voltage Vint to the driving gate electrode G1 of the driving thin film transistor T1, thereby initializing a voltage of the driving gate electrode G1 of the driving thin film transistor T1.

An operation control gate electrode G5 of the operation control thin film transistor T5 is connected to the emission control line EL, an operation control source electrode S5 of the operation control thin film transistor T5 is connected to the driving voltage line PL, and an operation control drain electrode D5 of the operation control thin film transistor T5 is connected to the driving source electrode S1 of the driving thin film transistor T1 and the switching drain electrode D2 of the switching thin film transistor T2.

An emission control gate electrode G6 of the emission control thin film transistor T6 is connected to the emission control line EL, an emission control source electrode S6 of the emission control thin film transistor T6 is connected to the driving drain electrode D1 of the driving thin film transistor T1 and the compensation source electrode S3 of the compensation thin film transistor T3, and an emission control drain electrode D6 of the emission control thin film transistor T6 is connected to the second initialization source electrode S7 of the second initialization thin film transistor T7 and the pixel electrode of the organic light-emitting diode OLED.

The operation control thin film transistor T5 and the emission control thin film transistor T6 are simultaneously (or concurrently) turned on in response to an emission control signal En transferred through the emission control line EL to allow the driving voltage ELVDD to be transferred to the organic light-emitting diode OLED and thus the driving current $I_{OLED}$ to flow through the organic light-emitting diode OLED.

A second initialization gate electrode G7 of the second initialization thin film transistor T7 is connected to the previous scan line SL-1, the second initialization source electrode S7 of the second initialization thin film transistor T7 is connected to the emission control drain electrode D6 of the emission control thin film transistor T6 and the pixel electrode of the organic light-emitting diode OLED, and the second initialization drain electrode D7 of the second initialization thin film transistor T7 is connected to the first initialization source electrode S4 of the first initialization thin film transistor T4 and the initialization voltage line VL. The second initialization thin film transistor T7 is turned on in response to a previous scan signal Sn-1 transferred through the previous scan line SL-1 and initializes the pixel electrode of the organic light-emitting diode OLED.

Though FIG. 4B shows the case where the first initialization thin film transistor T4 and the second initialization thin film transistor T7 are connected to the previous scan line SL-1, embodiments are not limited thereto. In another embodiment, the first initialization thin film transistor T4 may be connected to the previous scan line SL-1 and driven in response to a previous scan signal Sn-1, and the second initialization thin film transistor T7 may be connected to a separate signal line (for example, the next scan line) and driven in response to a signal transferred through the separate signal line.

A second electrode Cst2 of the storage capacitor Cst is connected to the driving voltage line PL, and an opposite electrode of the organic light-emitting diode OLED is connected to the common voltage ELVSS. Therefore, the organic light-emitting diode OLED may receive the driving current $I_{OLED}$ from the driving thin film transistor T1 and emit light to thereby display an image.

Though it is shown in FIG. 4B that the compensation thin film transistor T3 and the first initialization thin film transistor T4 each has a dual gate electrode, the compensation thin film transistor T3 and the first initialization thin film transistor T4 may each have one gate electrode.

In the present embodiment, the first pixel Pm and the second pixel Pa may include the same pixel circuit PC. However, embodiments are not limited thereto. For example, the first pixel Pm and the second pixel Pa may include pixel circuits PC having different structures. For example, the first pixel Pm may employ the pixel circuit of FIG. 4B, and the second pixel Pa may employ the pixel circuit of FIG. 4A. Various suitable modifications may be made.

Figure 5:
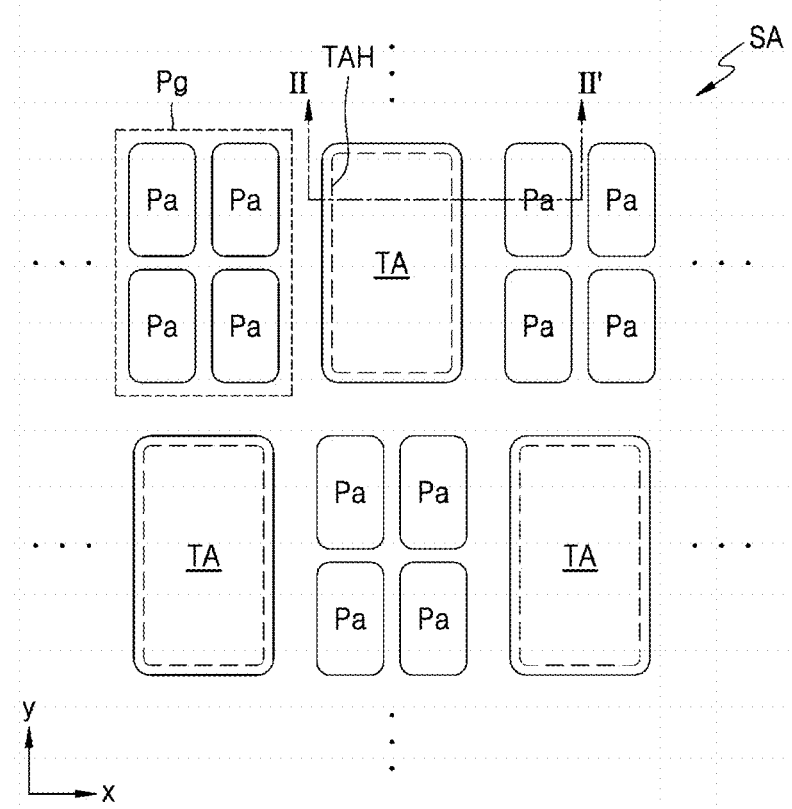
FIG. 5 is a plan view of a portion of a second display area of FIG. 3.
Figure 6A:
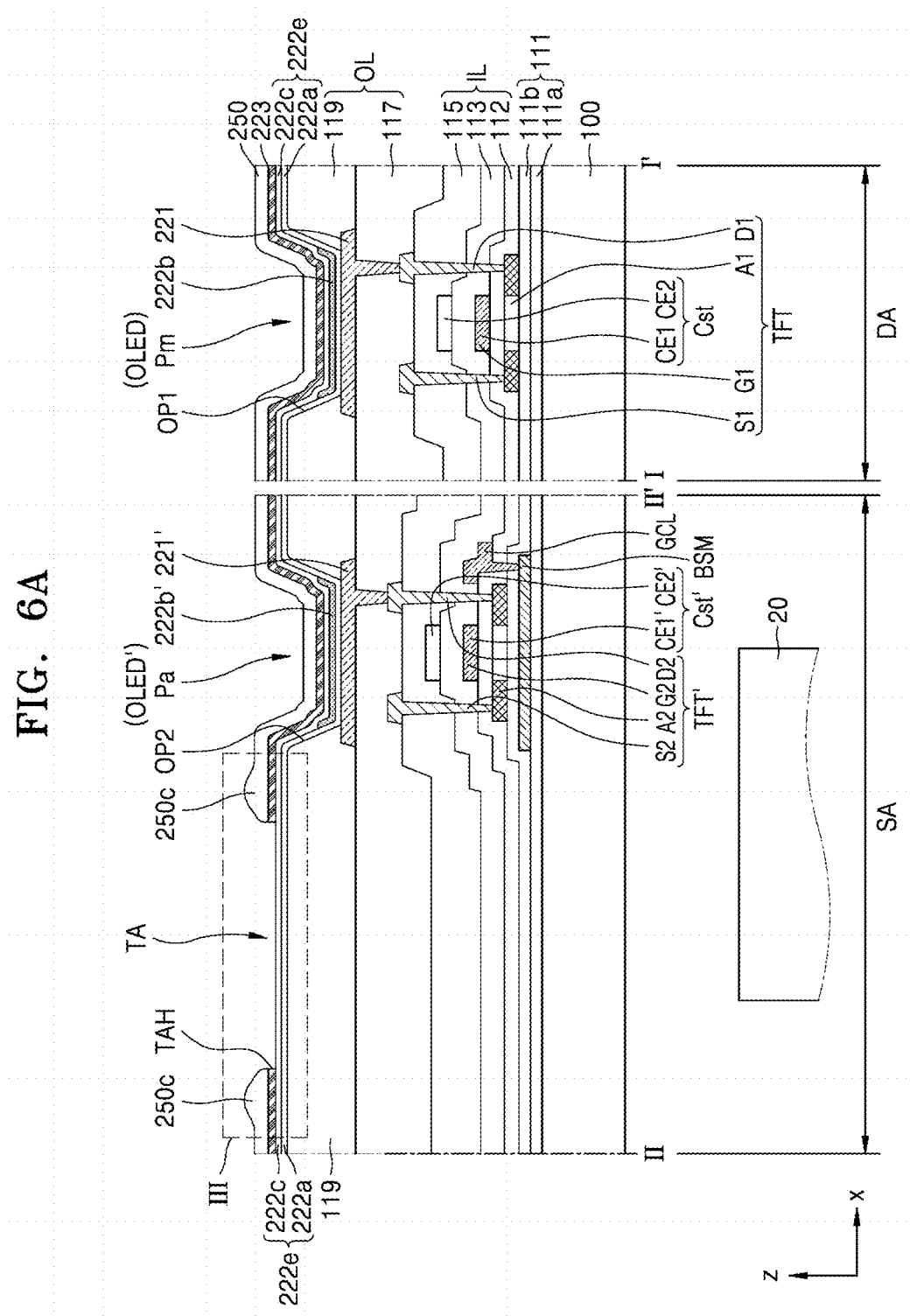
FIG. 6A is a cross-sectional view of a display device taken along the line I-I' of FIG. 3 and the line II-II' of FIG. 5.
Figure 6B:
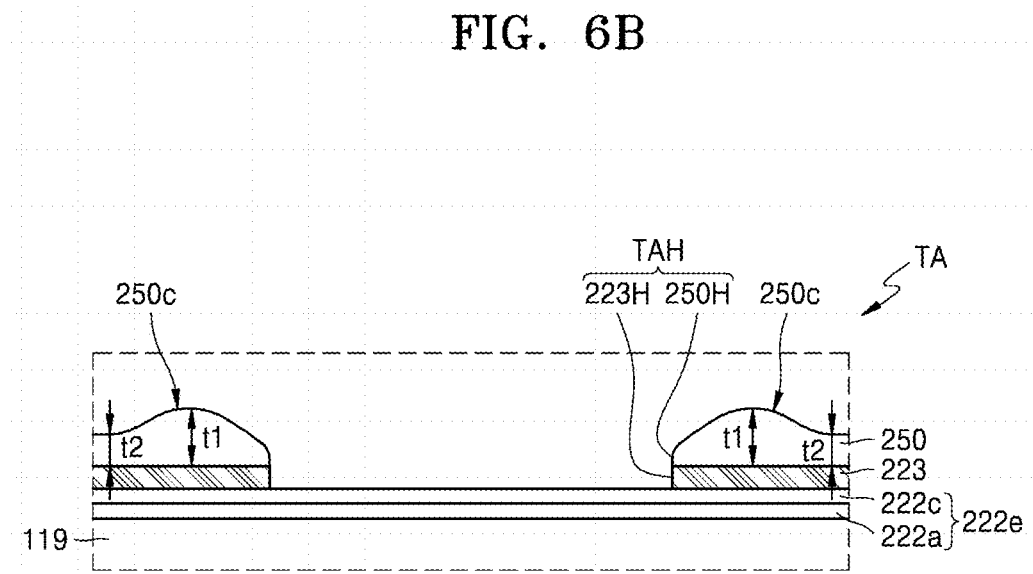
FIG. 6B is an enlarged view of the region III of FIG. 6A.

FIG. 5 is a plan view of a portion of the second display area SA of FIG. 3, and FIG. 6A is a cross-sectional view of the display device taken along the line I-I' of FIG. 3 and the line II-II' of FIG. 5 FIG. 6B is an enlarged view of the region III of FIG. 6A.

Referring to FIG. 5, second pixels Pa and transmissive areas TA are arranged in the second display area SA of the display device according to an embodiment. The second pixels Pa may be successively arranged to constitute one pixel group Pg. The pixel group Pg may include at least one second pixel Pa. It is shown in FIG. 5 that one pixel group Pg includes four second pixels Pa arranged in two columns. However, embodiments are not limited thereto. The number of second pixels Pa and the arrangement of second pixels Pa included in one pixel group Pg may be variously modified in a suitable manner. For example, one pixel group Pg may include three second pixels Pa arranged side by side in one column. In some examples, one pixel group Pg may include eight second pixels Pa arranged in four columns. The second pixels Pa may be arranged in various suitable arrangements such as a stripe arrangement, a mosaic arrangement, and a pentile arrangement.

The transmissive area TA is an area not including a display element and thus has a high light transmittance. The transmissive area TA may be provided as a plurality of transmissive areas TA in the second display area SA. The transmissive area TA and the pixel group Pg may be alternately arranged in a first direction (e.g., an x-direction) and/or a second direction (e.g., a y-direction). In some examples, the transmissive areas TA may surround the pixel groups Pg. In some examples, the second pixels Pa may surround the transmissive areas TA.

Referring to FIG. 6A, the display device according to an embodiment includes the first display area DA and the second display area SA. The first pixel Pm is arranged in the first display area DA, and the second pixel Pa and the transmissive area TA are arranged in the second display area SA.

The first pixel Pm may include a main thin film transistor TFT, a main storage capacitor Cst, and the main organic light-emitting diode OLED. The second pixel Pa may include a second thin film transistor TFT', an auxiliary storage capacitor Cst', and an auxiliary organic light-emitting diode OLED'. The transmissive area TA may include an opening area TAH corresponding to the transmissive area TA.

The component 20 may be arranged below the second display area SA. The component 20 may include an infrared (IR) sensor that transmits/receives an infrared ray. Since the transmissive area TA is arranged in the second display area SA, an infrared signal transmitted/received from/to the component 20 may pass through the second display area SA. For example, light emitted from the component 20 may progress in a z-direction through the transmissive area TA, and light that is generated from the outside of the display device and is incident to the component 20 may progress in a (−) z-direction through the transmissive area TA. In another embodiment, the component 20 may include an image sensor that captures an image. In an embodiment, the component 20 may include a plurality of image sensors, and one image sensor may correspond to the transmissive area TA.

Hereinafter, a structure in which elements of the display device according to an embodiment are stacked is described.

The substrate 100 may include glass or a polymer resin. The polymer resin may include polyethersulfone (PES), polyacrylate, polyetherimide (PEI), polyethylene naphthalate (PEN), polyethylene terephthalate (PET), polyphenylene sulfide (PPS), polyarylate, polyarylate, polyimide (PI), polycarbonate (PC), cellulose acetate propionate (CAP), and/or the like. The substrate 100 including the polymer resin may be flexible, rollable, or bendable. The substrate 100 may include a multi-layered structure including a layer including a polymer resin, and an inorganic layer.

A buffer layer 111 may be located on the substrate 100, may reduce or block the penetration of foreign substances, moisture, or external air from below the substrate 100, and provide a flat surface on the substrate 100. The buffer layer 111 may include an inorganic material, an organic material, or an organic/inorganic composite material, the inorganic material including an oxide and a nitride. The buffer layer 111 may have a single or multi-layered structure of an inorganic material and an organic material. A barrier layer may be further arranged between the substrate 100 and the buffer layer 111, the barrier layer blocking the penetration of external air. In an embodiment, the buffer layer 111 may include silicon oxide ($SiO_2$) or silicon nitride ($SiN_x$). The buffer layer 111 may include a first buffer layer 111a and a second buffer layer 111b that are stacked.

In the second display area SA, the bottom electrode layer BSM may be arranged between the first buffer layer 111a and the second buffer layer 111b. In another embodiment, the bottom electrode layer BSM may be arranged between the substrate 100 and the first buffer layer 111a. The bottom electrode layer BSM may be arranged below the second thin film transistor TFT' and may prevent or substantially prevent a characteristic of the second thin film transistor TFT' from being deteriorated by light emitted from the component 20, etc.

Also, the bottom electrode layer BSM may be connected to a wiring GCL arranged on a different layer through a contact hole. The bottom electrode layer BSM may receive a constant voltage or a signal from the wiring GCL. For example, the bottom electrode layer BSM may receive the driving voltage ELVDD or a scan signal. Since the bottom electrode layer BSM receives a constant voltage or a signal, a probability that electrostatic discharge occurs may be remarkably reduced. The bottom electrode layer BSM may include Al, Pt, Pd, Ag, Mg, Au, Ni, Nd, Ir, Cr, Li, Ca, Mo, Ti, W, and/or Cu. The bottom electrode layer BSM may have a single layer or a multi-layer structure including the above materials.

The main thin film transistor TFT and the second thin film transistor TFT' may be arranged on the buffer layer 111. The main thin film transistor TFT includes a first semiconductor layer A1, a first gate electrode G1, a first source electrode S1, and a first drain electrode D1. The second thin film transistor TFT' includes a second semiconductor layer A2, a second gate electrode G2, a second source electrode S2, and a second drain electrode D2. The main thin film transistor TFT may be connected to the main organic light-emitting diode OLED in the first display area DA to drive the main organic light-emitting diode OLED. The second thin film transistor TFT' may be connected to the auxiliary organic light-emitting diode OLED' in the second display area SA to drive the auxiliary organic light-emitting diode OLED'.

The first semiconductor layer A1 and the second semiconductor layer A2 may be arranged on the buffer layer 111 and may include polycrystalline silicon. In another embodiment, the first semiconductor layer A1 and the second semiconductor layer A2 may each include amorphous silicon. In another embodiment, the first semiconductor layer A1 and the second semiconductor layer A2 may include an oxide of at least one of In, Ga, Sn, Zr, V, Hf, Cd, Ge, CR, Ti, and Zn. The first semiconductor layer A1 and the second semiconductor layer A2 may each include a channel region, a source region, and a drain region. The source region and the drain region may be doped with impurities.

The first semiconductor layer A1 may overlap the bottom electrode layer BSM with the second buffer layer 111b therebetween. In an embodiment, a width of the first semiconductor layer A1 may be less than a width of the bottom electrode layer BSM. Therefore, in a direction perpendicular to the substrate 100, the first semiconductor layer A1 may entirely overlap the bottom electrode layer BSM.

A first gate insulating layer 112 may cover the first semiconductor layer A1 and the second semiconductor layer A2. The first gate insulating layer 112 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$). The first gate insulating layer 112 may include a single layer or a multi-layer including the above inorganic insulating materials.

The first gate electrode G1 and the second gate electrode G2 are arranged on the first gate insulating layer 112 to respectively overlap the first semiconductor layer A1 and the second semiconductor layer A2. The first gate electrode G1 and the second gate electrode G2 may each include at least one of Mo, Al, Cu, and Ti, and have a single layer or a multi-layer structure. For example, the first gate electrode G1 and the second gate electrode G2 may each include a single Mo layer.

A second gate insulating layer 113 may cover the first gate electrode G1 and the second gate electrode G2. The second gate insulating layer 113 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$). The first gate insulating layer 112 may have a single layer or a multi-layer structure including the above inorganic insulating materials.

A first top electrode CE2 of the main storage capacitor Cst and a second top electrode CE2' of the auxiliary storage capacitor Cst' may be arranged on the second gate insulating layer 113.

In the first display area DA, the first top electrode CE2 may overlap the first gate electrode G1 therebelow. The first gate electrode G1 and the first top electrode CE2 may constitute the main storage capacitor Cst, the first gate electrode G1 and the first top electrode CE2 overlapping each other with the second gate insulating layer 113 therebetween. The first gate electrode G1 may serve as a first bottom electrode CE1 of the main storage capacitor Cst.

In the second display area SA, the second top electrode CE2' may overlap the second gate electrode G2 therebelow. The second gate electrode G2 and the second top electrode CE2' may constitute the auxiliary storage capacitor Cst', the second gate electrode G2 and the second top electrode CE2' overlapping each other with the second gate insulating layer 113 therebetween. The second gate electrode G2 may serve as a second bottom electrode CE1' of the auxiliary storage capacitor Cst'.

The first top electrode CE2 and the second top electrode CE2' may each include Al, Pt, Pd, Ag, Mg, Au, Ni, Nd, Ir, Cr, Li, Ca, Mo, Ti, W, and/or Cu, and may have a single layer or a multi-layer structure including the above materials.

An interlayer insulating layer 115 may cover the first top electrode CE2 and the second top electrode CE2'. The interlayer insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), and/or the like.

When the first gate insulating layer 112, the second gate insulating layer 113, and the interlayer insulating layer 115 are collectively referred to as inorganic insulating layers IL, a structure in which inorganic insulating layers IL are stacked on the substrate 100 may have a transmittance of 90% or more. For example, light having a wavelength ranging from about 900 nm to about 1100 nm and passing through the substrate 100 and the inorganic insulating layers IL may have a transmittance of about 90%.

The source electrodes S1 and S2 and the drain electrodes D1 and D2 are arranged on the interlayer insulating layer 115. The source electrodes S1 and S2 and the drain electrodes D1 and D2 may include a conductive material including Mo, Al, Cu, and Ti, and may have a single layer or a multi-layer structure including the above materials. For example, the source electrodes S1 and S2 and the drain electrodes D1 and D2 may have a multi-layered structure of Ti/Al/Ti.

A planarization layer 117 may cover the source electrodes S1 and S2 and the drain electrodes D1 and D2. The planarization layer 117 may have a flat top surface such that a first pixel electrode 221 and a second pixel electrode 221' arranged thereon are flat.

The planarization layer 117 may have a single layer or a multi-layer structure including an organic material. The planarization layer 117 may include a general-purpose polymer such as benzocyclobutene (BCB), polyimide, hexamethyldisiloxane (HMDSO), polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof.

An opening is provided in the planarization layer 117, the opening exposing one of the first source electrode S1 and the first drain electrode D1 of the main thin film transistor TFT. The first pixel electrode 221 may be electrically connected to the main thin film transistor TFT by contacting the first source electrode S1 or the first drain electrode D1 through the opening.

Also, an opening is provided in the planarization layer 117, the opening exposing one of the second source electrode S2 and the second drain electrode D2 of the second thin film transistor TFT'. The second pixel electrode 221' may be electrically connected to the second thin film transistor TFT' by contacting the second source electrode S2 or the second drain electrode D2 through the opening.

The first pixel electrode 221 and the second pixel electrode 221' may include a conductive oxide such as indium tin oxide (ITO), zinc oxide (IZO), zinc oxide (ZnO), indium oxide ($In_2O_3$), indium gallium oxide (IGO), or aluminum zinc oxide (AZO). In another embodiment, the first pixel electrode 221 and the second pixel electrode 221' may each include a reflective layer including Ag, Mg, Al, Pt, Pd, Au, Ni, Nd, Ir, Cr, or a compound thereof. In another embodiment, the first pixel electrode 221 and the second pixel electrode 221' may further include a layer including ITO, IZO, ZnO, or $In_2O_3$ on/under the reflective layer. In another embodiment, the first pixel electrode 221 and the second pixel electrode 221' may have a stacked structure of ITO/Ag/ITO.

A pixel-defining layer 119 may cover edges of each of the first pixel electrode 221 and the second pixel electrode 221'. The pixel-defining layer 119 includes a first opening OP1 and a second opening OP2, the first opening OP1 and the second opening OP2 respectively overlapping the first pixel electrode 221 and the second pixel electrode 221' and defining an emission area of a pixel. The pixel-defining layer 119 may prevent or substantially prevent an arc (e.g., an electric arc), etc. from occurring at edges of the pixel electrodes, that is, at the edges of the first and second pixel electrodes 221 and 221', by increasing a distance between the edges of the first and second pixel electrodes 221 and 221', and the opposite electrode 223 over the first and second pixel electrodes 221 and 221'. The pixel-defining layer 119 may include an organic insulating material such as polyimide, polyamide, an acrylic resin, BCB, HMDSO, and a phenolic resin. The pixel-defining layer 119 may be formed by a method such as spin coating.

When the planarization layer 117 and the pixel-defining layer 119 are referred to as organic insulating layers OL, the organic insulating layer OL may have a transmittance of 90% or more with respect to an infrared wavelength. For example, light having a wavelength ranging from about 900 nm to about 1100 nm and passing through the organic insulating layer OL may have a transmittance of about 90%.

A first emission layer $222b$ and a second emission layer $222b'$ are respectively arranged in the first opening OP1 and the second opening OP2 of the pixel-defining layer 119, the first emission layer $222b$ and a second emission layer $222b'$ respectively corresponding to the first pixel electrode 221 and the second pixel electrode 221'. The first emission layer $222b$ and the second emission layer $222b'$ may include a polymer material or a low molecular weight material, and emit red, green, blue, or white light.

An organic function layer $222e$ may be arranged on and/or under the first emission layer $222b$ and the second emission layer $222b'$. The organic functional layer $222e$ may include a first functional layer $222a$ and a second functional layer $222c$. The first functional layer $222a$ or the second functional layer $222c$ may be omitted.

The first functional layer $222a$ may be arranged under the first emission layer $222b$ and the second emission layer $222b'$. The first functional layer $222a$ may have a single layer or a multi-layer structure including an organic material. The first functional layer $222a$ may include a hole transport layer (HTL) having a single-layered structure. In some examples, the first functional layer $222a$ may include a hole injection layer (HIL) and an HTL. The first functional layer $222a$ may be provided as one body (e.g., one contiguous body) so as to correspond to the first pixels Pm and the second pixels Pa included in the first display area DA and the second display area SA. Therefore, the first functional layer $222a$ may correspond to the transmissive area TA.

The second functional layer $222c$ may be arranged on the first emission layer $222b$ and the second emission layer $222b'$. The second functional layer $222c$ may have a single layer or a multi-layer structure including an organic material. The second functional layer $222c$ may include an electron transport layer (ETL) and/or an electron injection layer (EIL). The second function layer $222c$ may be provided as one body (e.g., one contiguous body) so as to correspond to the first pixels Pm and the second pixels Pa included in the first display area DA and the second display area SA. Therefore, the second functional layer $222c$ may correspond to the transmissive area TA.

The opposite electrode 223 is arranged on the second functional layer $222c$. The opposite electrode 223 may include a conductive material having a small work function. For example, the opposite electrode 223 may include a (semi) transparent layer including Ag, Mg, Al, Pt, Pd, Au, Ni, Nd, Ir, Cr, Li, Ca, or an alloy thereof. In some examples, the opposite electrode 223 may further include a layer including ITO, IZO, ZnO, or $In_2O_3$ on the (semi) transparent layer including the above material. The opposite electrode 223 may be provided as one body (e.g., one contiguous body) so as to correspond to the first pixels Pm and the second pixels Pa included in the first display area DA and the second display area SA.

Layers ranging from the first pixel electrode 221 to the opposite electrode 223 in the first display area DA may constitute the main organic light-emitting diode OLED. Layers ranging from the second pixel electrode 221' to the opposite electrode 223 in the second display area SA may constitute the auxiliary organic light-emitting diode OLED'.

A top layer 250 may be formed on the opposite electrode 223, the top layer 250 including an organic material. The top layer 250 may include a layer for protecting the opposite electrode 223 and simultaneously increasing a light extraction efficiency. The top layer 250 may include an organic material having a refractive index greater than that of the opposite electrode 223. In some examples, the top layer 250 may include layers having different refractive indexes that are stacked. For example, the top layer 250 may include a layer having a high refractive index, a layer having a low refractive index, and a layer having a high refractive index that are stacked. In this case, a refractive index of the layer having a high refractive index may be 1.7 or more, and a refractive index of the layer having a low refractive index may be 1.3 or less.

The top layer 250 may further include LiF. In some examples, the top layer 250 may further include an inorganic insulating material such as silicon oxide ($SiO_2$) and silicon nitride ($SiN_x$).

In the present embodiment, the opposite electrode 223 and the top layer 250 may each include an opening area TAH corresponding to the transmissive area TA. That is, the opposite electrode 223 and the top layer 250 may respectively have an opening 223H and an opening 250H, each corresponding to the transmissive area TA. In an embodiment, widths of the openings 223H and 250H constituting the opening area TAH may be substantially the same. For example, a width of the opening 223H of the opposite electrode 223 may be substantially the same as a width of the opening area TAH. The opening area TAH corresponds to the transmissive area TA may mean that the opening area TAH overlaps the transmissive area TA.

Since forming of the opening area TAH corresponding to the transmissive area TA means that a member such as the opposite electrode 223 is removed, a light transmittance in the transmissive area TA may be remarkably increased.

The substrate 100, the inorganic insulating layer IL, the organic insulating layer OL, and the organic functional layer 222e may be arranged in the transmissive area TA. In this case, an absorption rate of a structure in which the substrate 100, the inorganic insulating layer IL, the organic insulating layer OL, and the organic functional layer 222e are stacked in the transmissive area TA, with respect to infrared light may be 20% or less.

Referring to FIG. 6B, the opening area TAH may include the opening 223H of the opposite electrode 223 and the opening 250H of the top layer 250. The opening 223H of the opposite electrode 223 may expose a top surface of the organic functional layer 222e. The opening 250H of the top layer 250 may correspond to the opening 223H of the opposite electrode 223 and expose the top surface of the organic functional layer 222e. The opening 223H of the opposite electrode 223 may have substantially the same area as an area of the opening 250H of the top layer 250.

In the present embodiment, the top layer 250 includes a convex portion 250C that neighbors the opening area TAH. The convex portion 250C may have a thickness t1 greater than a neighboring thickness t2. Though it is shown in the drawing that the thickness of the convex portion 250C gradually increases and then gradually decreases, embodiments are not limited thereto. For example, the convex portion 250C may include a flat top surface having a thickness t1 greater than the neighboring thickness t2. The convex portion 250C may be formed during a process of forming the opening area TAH. A process of forming the convex portion 250C is described below.

Figure 7A:
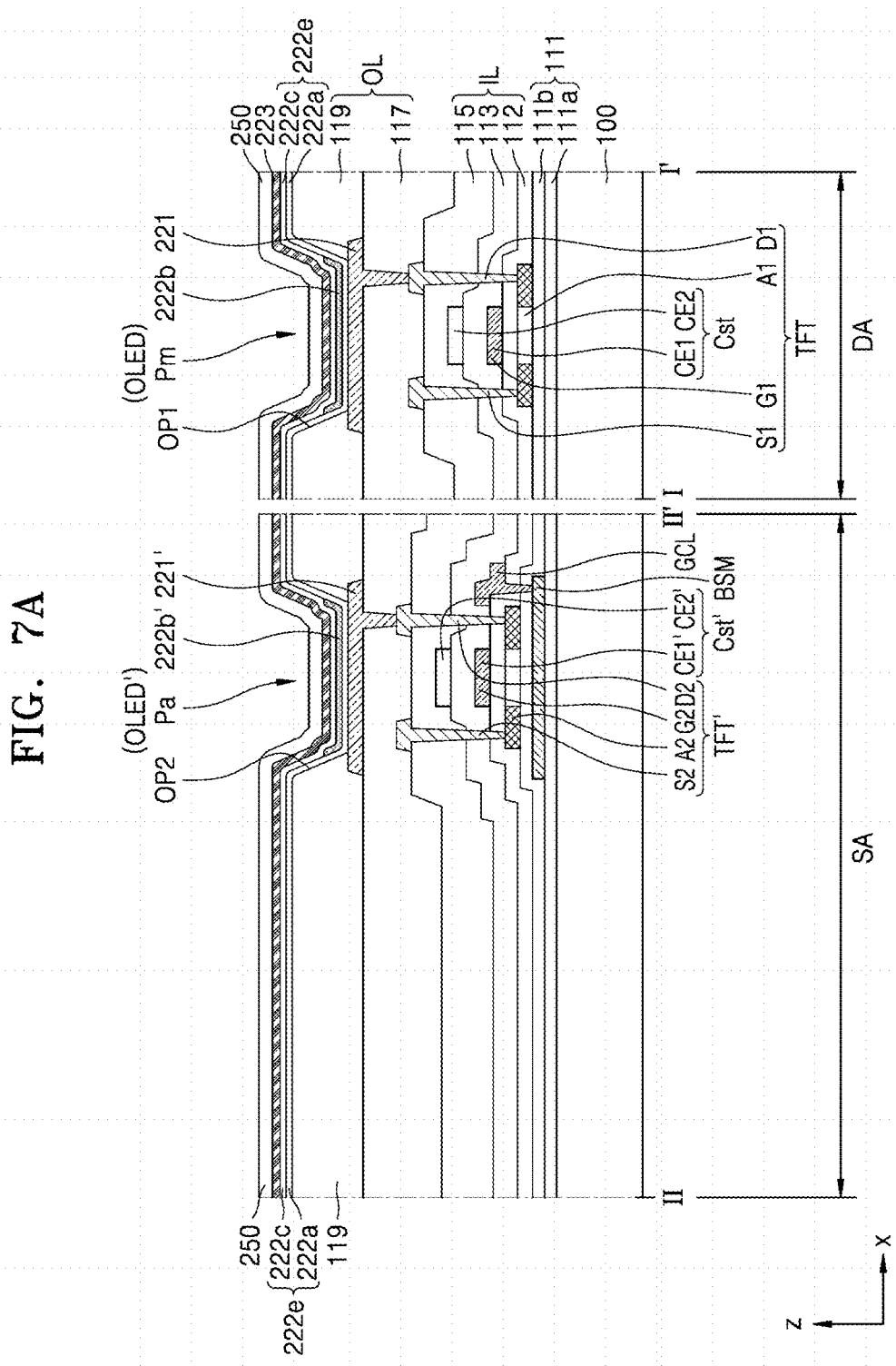
FIGS. 7A to 7C are cross-sectional views of a method of manufacturing a display device, according to an example embodiment.
Figure 7B:
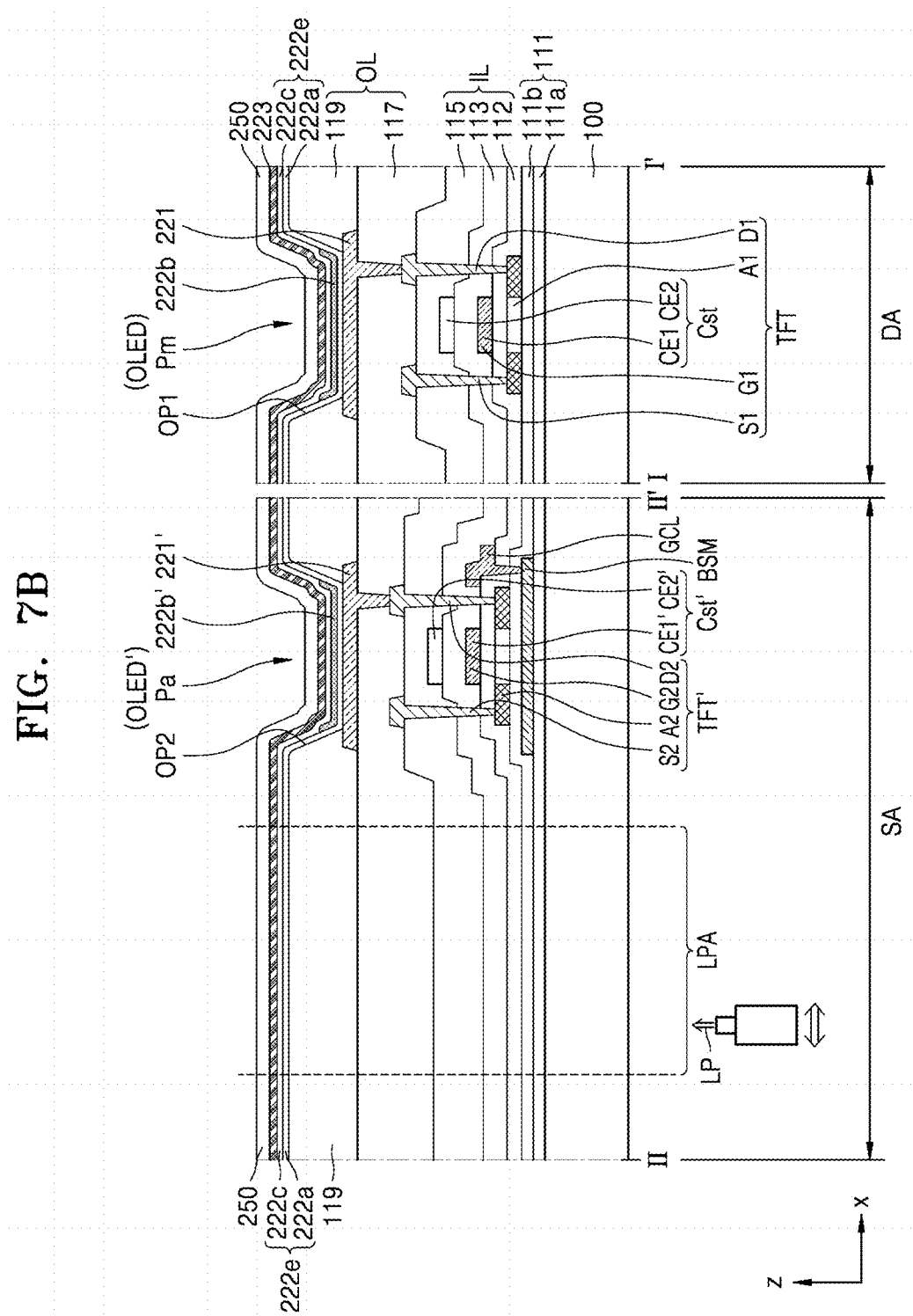
Figure 7C:
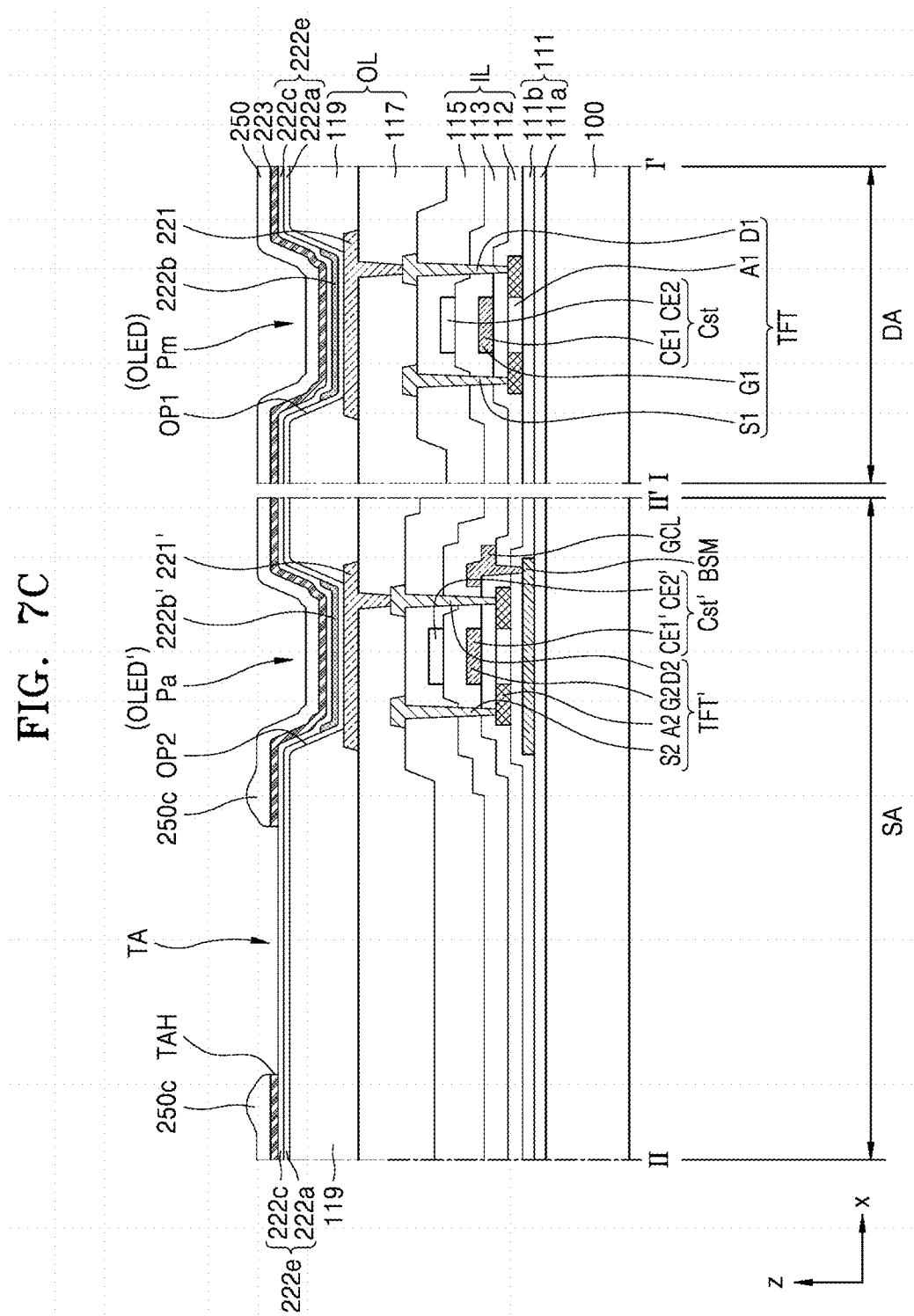

FIGS. 7A to 7C are cross-sectional views of a method of manufacturing a display device according to an embodiment.

Referring to FIG. 7A, the opposite electrode 223 is formed as one body (e.g., one contiguous body) in the first display area DA and the second display area SA, and the top layer 250 is formed thereon. That is, the opposite electrode 223 and the top layer 250 are formed to cover the transmissive area TA.

The opposite electrode 223 may include a metal that absorbs light in an infrared wavelength band (e.g. about 800 nm to about 3000 nm). The opposite electrode 223 may include Ag, Mg, Al, Pt, Pd, Au, Ni, Nd, Ir, Cr, Li, Ca, or an alloy thereof.

The thickness of the opposite electrode 223 may be about 5 Å to about 300 Å.

The top layer 250 may include an organic material. In an embodiment, the top layer 250 may include an organic material having a refractive index greater than that of the opposite electrode 223. In some examples, the top layer 250 may include layers having different refractive indexes that are stacked. For example, the top layer 250 may include a layer having a high refractive index, a layer having a low refractive index, and a layer having a high refractive index that are stacked. In this case, a refractive index of the layer having a high refractive index may be 1.7 or more, and a refractive index of the layer having a low refractive index may be 1.3 or less.

The top layer 250 may further include LiF. In some examples, the top layer 250 may further include an inorganic insulating material such as silicon oxide ($SiO_2$) and silicon nitride ($SiN_x$).

Next, referring to FIG. 7B, a laser light LP is irradiated on the opposite electrode 223 arranged in the transmissive area TA from a backside of the substrate 100. That is, the laser light LP may progress in a z-direction from the backside of the substrate 100 and may be irradiated on a backside of the opposite electrode 223. The laser light LP may have an infrared wavelength. In the case where the laser light LP is an infrared ray, since a transmittance of the substrate 100, the buffer layer 111, the inorganic insulating layer IL, the organic insulating layer OL, and the organic functional layer 222e is about 80% to about 90%, the laser light LP may efficiently reach the opposite electrode 223.

Since the opposite electrode 223 includes a metal that absorbs infrared light, the opposite electrode 223 may absorb the laser light LP. Therefore, thermal expansion of the opposite electrode 223 occurs and the opposite electrode 223 on which the laser light LP is irradiated may be lifted-off from the organic functional layer 222e thereunder.

When the opposite electrode 223 is lifted-off, the top layer 250 arranged on the opposite electrode 223 that is lifted-off may also be removed together with the opposite electrode 223. Therefore, as shown in FIG. 7C, the opening 223H of the opposite electrode 223 and the opening 250H of the top layer 250 may be simultaneously (or concurrently) formed. The opening area TAH may be formed by the opening 223H of the opposite electrode 223 and the opening 250H of the top layer 250.

In this case, the top layer 250 includes the convex portion 250C around the opening area TAH. Since heat corresponding to absorption of the laser light LP may be transferred to not only the opposite electrode 223 on which the laser light LP is irradiated but also the surroundings of the opposite electrode 223, the organic material included in the top layer 250 is collected by the heat to constitute the convex portion 250C.

In the case where the laser light LP is not irradiated on the opposite electrode 223 and is irradiated on a sacrificial metal layer arranged on a layer different from a layer on which the opposite electrode 223 is arranged, since the top layer 250 is apart from the sacrificial metal layer, the convex portion is not formed.

In contrast, according to the present embodiment, since the laser light LP is irradiated on the opposite electrode 223 that directly contacts the top layer 250 and the laser light LP is absorbed in the opposite electrode 223, the convex portion 250C may be formed in a portion of the top layer 250.

For the laser light LP, light having a wavelength of 800 nm or more may be used. In an embodiment, for the laser light LP, light having a wavelength ranging from about 1000 nm to about 1100 nm may be used. In an embodiment, the laser light LP may be provided as a pulse with an duration of a nano second. The power of the laser light LP may be adjusted by a parameter such as a frequency, a wavelength, and a spot overlap degree.

The laser light LP may be scanned on the transmissive area TA many times in a scan direction of one direction. Therefore, a pattern by the laser light LP may be formed in the organic functional layer 222e and/or the pixel-defining layer 119 under the opposite electrode 223.

Since the component 20 (see FIG. 6A) may be arranged in the second display area SA of the display device according to an embodiment, the substrate 100, the buffer layer 111, the inorganic insulating layer IL, and the organic insulating layer OL each having a high transmittance with respect to an infrared ray may be provided in the second display area SA.

Therefore, for the laser light LP for forming the opening area TAH, laser light having an infrared wavelength band is used, since the laser light passes through layers arranged under the opposite electrode 223 and having a high transmittance, and most of the laser light is absorbed by the opposite electrode 223, lift-off of the opposite electrode 223 may be easily made.

Figure 8A:
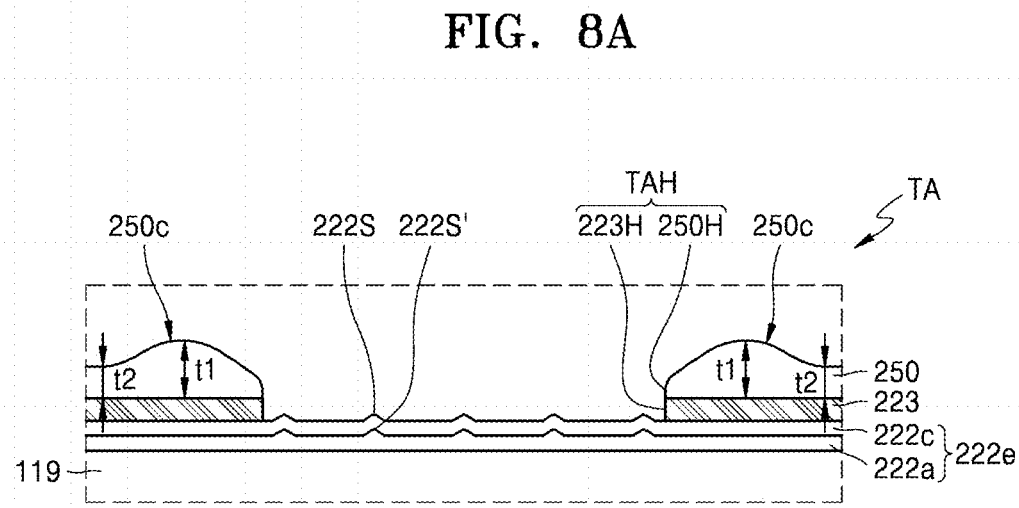
FIG. 8A is a cross-sectional view of a display device according to another example embodiment.
Figure 8B:
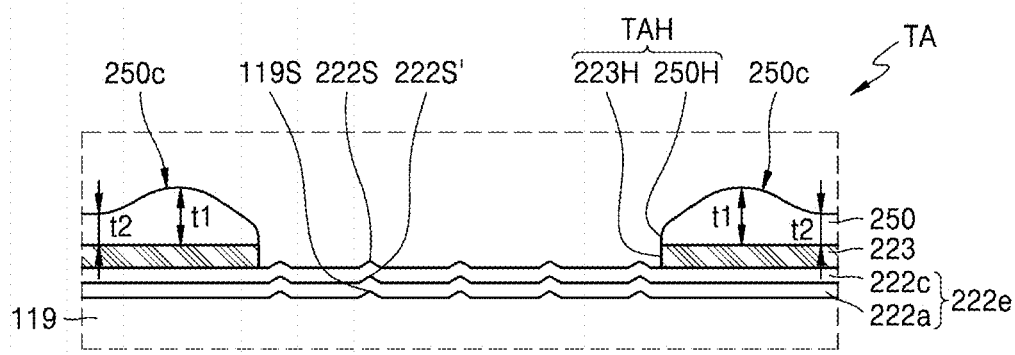
FIG. 8B is a cross-sectional view of a display device according to another example embodiment.
Figure 8C:
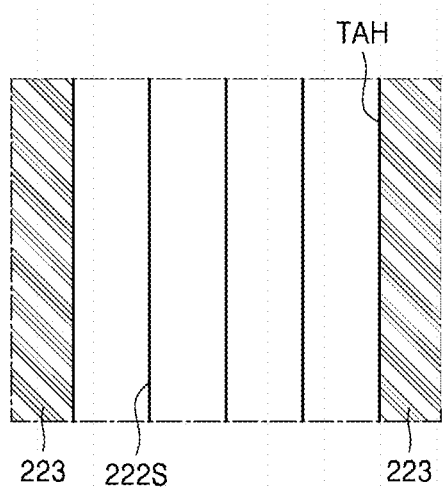
FIG. 8C is a cross-sectional view of a display device according to another example embodiment.

FIGS. 8A and 8B are cross-sectional views of a portion of a display device according to another embodiment and specifically show surroundings of the transmissive area TA. FIG. 8C is a plan view of the embodiment of FIG. 8A or 8B. In FIGS. 8A to 8C, since same reference numerals as those in FIG. 6B denote the same elements, repeated descriptions thereof are omitted.

Referring to FIGS. 8A and 8B, each of the opposite electrode 223 and the top layer 250 of the display device according to an embodiment includes the opening area TAH corresponding to the transmissive area TA. The top layer 250 includes the convex portion 250C that neighbors the opening area TAH.

In the present embodiment, a plurality of protrusion patterns 222S may be provided on a top surface of the organic functional layer 222e corresponding to the opening area TAH. The protrusion patterns 222S may be formed during a process of lifting off the opposite electrode 223 by using the laser light LP. As described above, in the present embodiment, the laser light LP is irradiated on the opposite electrode 223 so as to form the opening area TAH. Therefore, the opposite electrode 223 corresponding to the opening area TAH absorbs heat by the laser light LP. Since such heat is transferred to the organic functional layer 222e arranged under the opposite electrode 223, the protrusion patterns 222S by the heat of the laser light LP may be formed on the top surface of the organic functional layer 222e.

The shape and the size of the protrusion patterns 222S may be different depending on a size of a spot of the laser light LP and an overlap degree when scanning the laser light LP. In an embodiment, a protruding degree of the protrusion patterns 222S may be about 10 Å.

The organic functional layer 222e may include the first functional layer 222a and the second functional layer 222c that are stacked. In this case, the protrusion patterns 222S may be formed on a top surface of the second functional layer 222c. Also, as shown in FIG. 8A, the protrusion pattern 222S' may be formed on a top surface of the first functional layer 222a. In another embodiment, as shown in FIG. 8B, protrusion patterns 119S may be formed on a top surface of the pixel-defining layer 119.

Referring to FIG. 8C, an embossed portion of the protrusion patterns 222S may extend in one direction. This may mean that scanning of the laser light LP has been performed in the one direction. Also, the protrusion pattern 222S may be provided as a plurality of protrusion patterns. The plurality of protrusion patterns may be apart from each other at a set or predetermined interval. The interval may correspond to a spot size of the laser light LP.

A shape and a separation distance of an embossed portion of the protrusion patterns 222S may be variously provided depending on a scanning direction and a spot size of the laser light LP. For example, in the case where scanning of the laser light LP is performed in a zigzag or a circular shape, the shape of the embossed portion of the protrusion pattern 222S may be provided in a zigzag or a circular shape.

Figure 9:
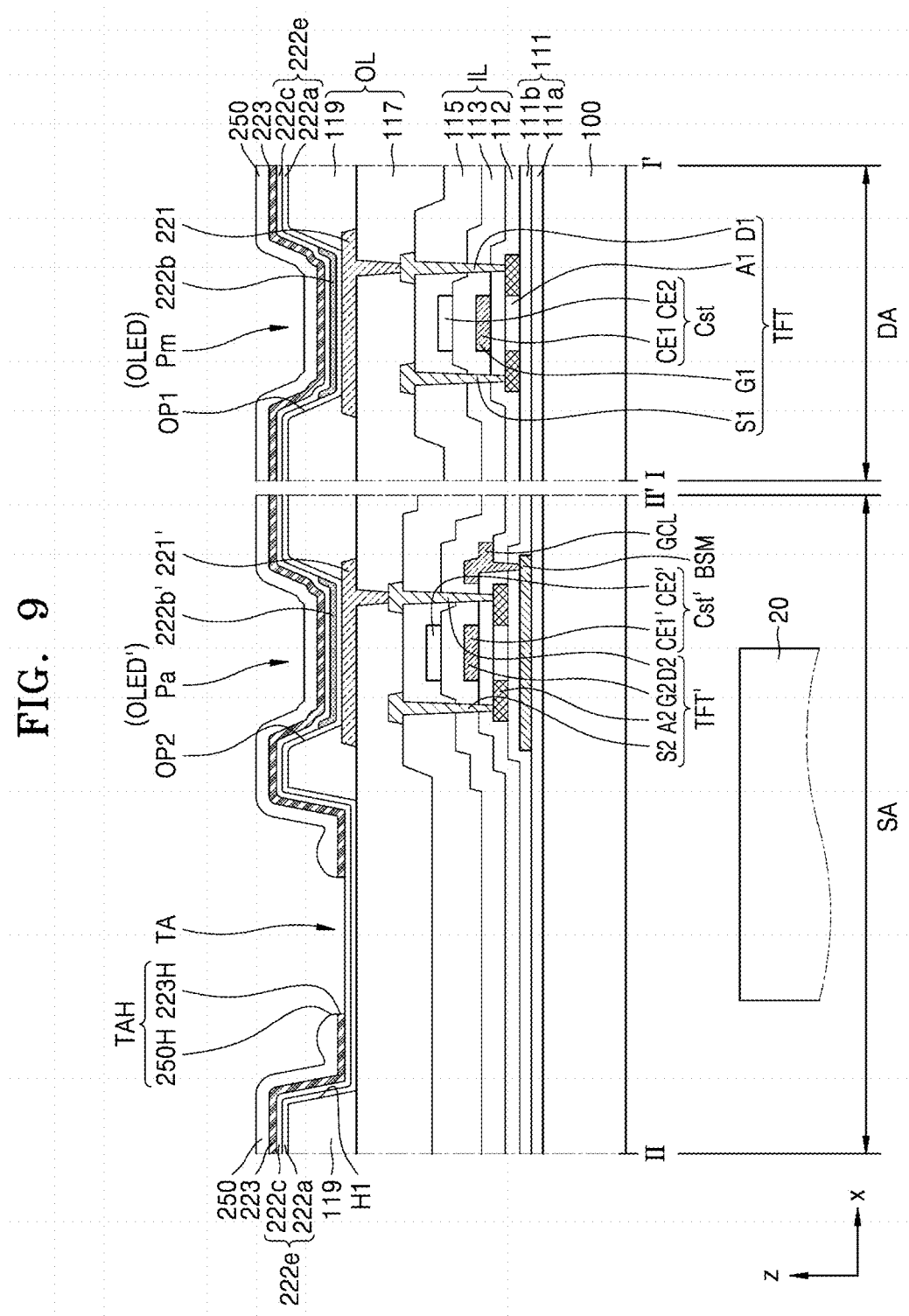
FIG. 9 is a cross-sectional view of a display device according to another example embodiment.

FIG. 9 is a cross-sectional view of a display device according to another embodiment. In FIG. 9, since same reference numerals as those in FIG. 6B denote the same elements, repeated descriptions thereof are omitted.

Referring to FIG. 9, the display device according to the present embodiment includes the first display area DA and the second display area SA, which includes the transmissive area TA. Each of the opposite electrode 223 and the top layer 250 of the display device includes the opening area TAH corresponding to the transmissive area TA. The top layer 250 includes the convex portion 250C that neighbors the opening area TAH.

In the present embodiment, the pixel-defining layer 119 may include a first opening H1 located in the transmissive area TA. Since the first opening H1 is formed in the pixel-defining layer 119, a light transmittance of the transmissive area TA may be improved. The opening area TAH may be formed inside the first opening H1. In an embodiment, a width of the opening area TAH may be less than a width of the first opening H1. Therefore, the organic functional layer 222e, the opposite electrode 223, and the top layer 250 may be arranged on an inner wall of the first opening H1. However, embodiments are not limited thereto.

For example, the width of the opening area TAH may be greater than the width of the first opening H1, and a lateral wall of the opening area TAH may be arranged on a top surface of the pixel-defining layer 119.

Figure 10:
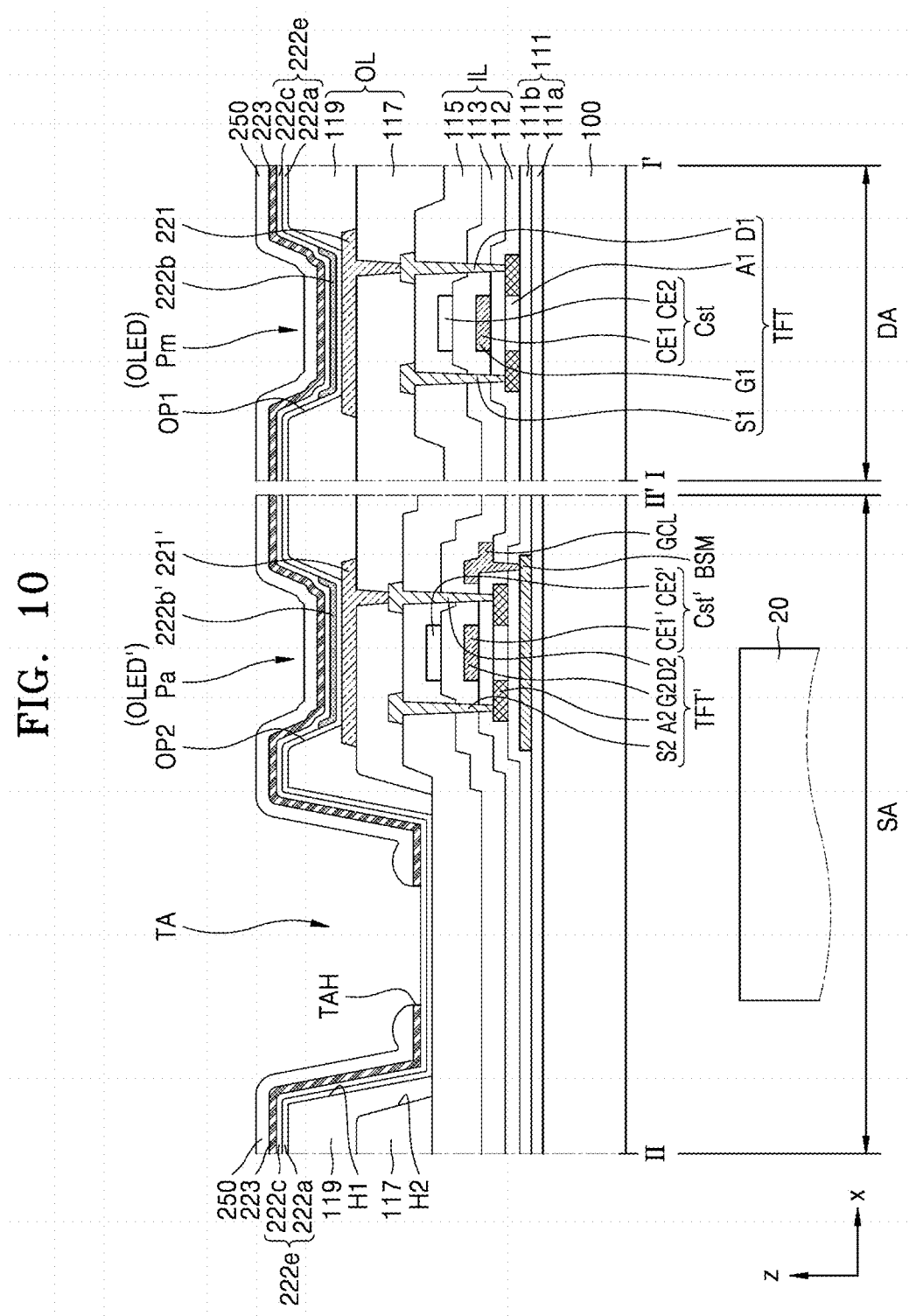
FIG. 10 is a cross-sectional view of a display device according to another example embodiment.

FIG. 10 is a cross-sectional view of a display device according to another embodiment. In FIG. 10, since same reference numerals as those in FIG. 6A denote the same elements, repeated descriptions thereof are omitted.

Referring to FIG. 10, the display device according to the present embodiment includes the first display area DA and the second display area SA, the second display area SA including the transmissive area TA. Each of the opposite electrode 223 and the top layer 250 of the display device includes the opening area TAH corresponding to the transmissive area TA. The top layer 250 includes the convex portion 250C that neighbors the opening area TAH.

In the present embodiment, the pixel-defining layer 119 may include a first opening H1 located in the transmissive area TA, and the planarization layer 117 may include a second opening H2 located in the transmissive area TA. The second opening H2 may overlap the first opening H1. Though it is shown in the drawing that a lower width of the second opening H2 is greater than a lower width of the first opening H1 and thus the pixel-defining layer 119 covers an inner wall of the second opening H2, embodiments are not limited thereto. For example, the width of the second opening H2 of the planarization layer 117 may be less than the width of the first opening H1 of the pixel-defining layer 119. Since the first opening H1 and the second opening H2 are formed, a light transmittance of the transmissive area TA may be improved.

The opening area TAH may be formed inside the first opening H1 and the second opening H2. In an embodiment, a width of the opening area TAH may be less than the widths of the first opening H1 and the second opening H2. Therefore, the organic functional layer 222e, the opposite electrode 223, and the top layer 250 may be arranged on an inner wall of the first opening H1. However, embodiments are not limited thereto.

For example, the width of the opening area TAH may be greater than the width of the first opening H1, and a lateral wall of the opening area TAH may be arranged on a top surface of the pixel-defining layer 119.

Figure 11:
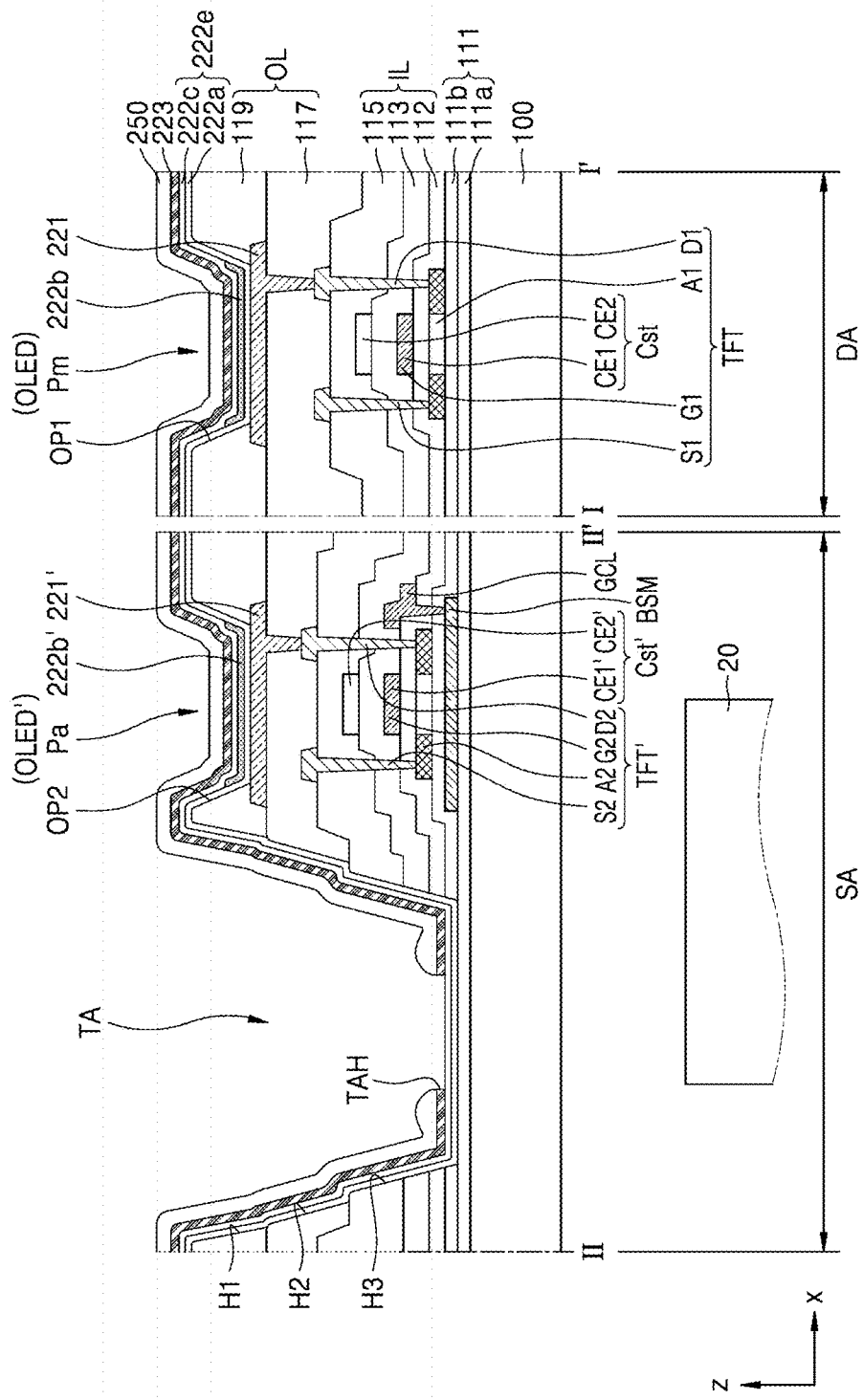
FIG. 11 is a cross-sectional view of a display device according to another example embodiment.

FIG. 11 is a cross-sectional view of a display device according to another embodiment. In FIG. 11, since same reference numerals as those in FIG. 6A denote the same elements, repeated descriptions thereof are omitted.

Referring to FIG. 11, the display device according to the present embodiment includes the first display area DA and the second display area SA, the second display area SA including the transmissive area TA. Each of the opposite electrode 223 and the top layer 250 of the display device includes the opening area TAH corresponding to the transmissive area TA. The top layer 250 includes the convex portion 250C that neighbors the opening area TAH.

In the present embodiment, the pixel-defining layer 119 may include a first opening H1 located in the transmissive area TA, and the planarization layer 117 may include a second opening H2 located in the transmissive area TA. The second opening H2 may overlap the first opening H1. Also, a third opening H3 may be arranged in an inorganic insulating layer IL.

The third opening H3 may expose a top surface of the buffer layer 111 or the substrate 100. The third opening H3 may include an opening of the first gate insulating layer 112, an opening of the second gate insulating layer 113, and an opening of the interlayer insulating layer 115 that overlap one another. The openings may be respectively formed through a separate process, or simultaneously (or concurrently) formed through the same process. In some examples, the opening of the first gate insulating layer 112 and the opening of the second gate insulating layer 113 may be simultaneously (or concurrently) formed, and the opening of the interlayer insulating layer 115 may be separately formed. Various suitable modifications may be made. In the case where the openings are formed through a separate process, a step difference may be formed on a lateral surface of the third opening H3.

Also, the inorganic insulating layer IL may include a groove instead of the third opening H3 that exposes the buffer layer 111. For example, the first gate insulating layer 112 of the inorganic insulating layer IL may be continuously arranged to correspond to the transmissive area TA, and the second gate insulating layer 113 and the interlayer insulating layer 115 may respectively include the openings corresponding to the transmissive area TA.

In some examples, the first gate insulating layer 112 and the second gate insulating layer 113 may be continuously arranged to correspond to the transmissive area TA, and the interlayer insulating layer 115 may include the opening corresponding to the transmissive area TA. Various suitable modifications may be made.

The third opening H3 may overlap the first opening H1 and the second opening H2. Since the first opening H1, the second opening H2, and the third opening H3 are formed, a light transmittance of the transmissive area TA may be improved. The organic functional layer 222e, the opposite electrode 223, and the top layer 250 may be arranged on the inner walls of the first opening H1, the second opening H2, and the third opening H3.

Figure 12:
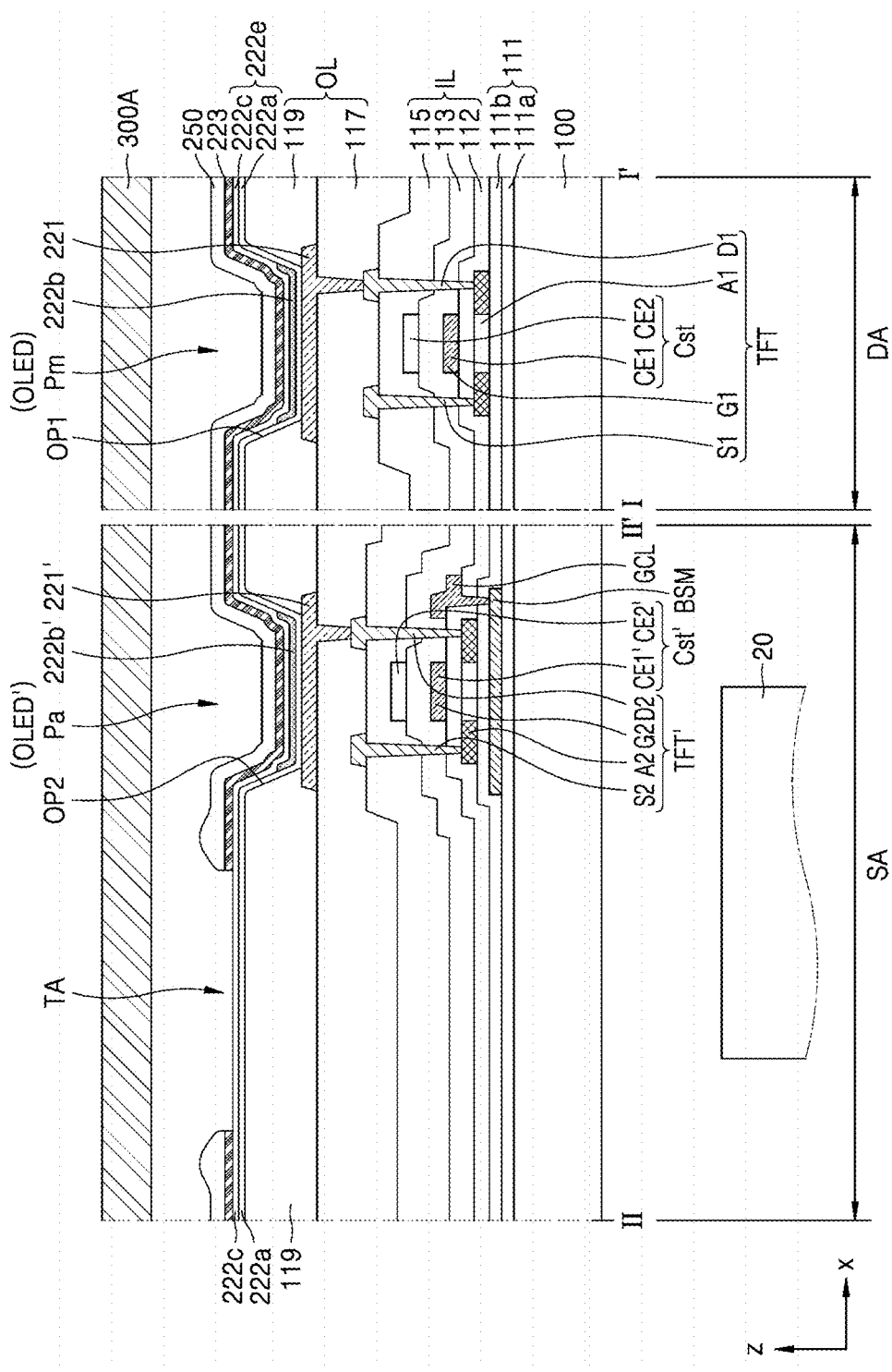
FIG. 12 is a cross-sectional view of a display device according to another example embodiment.

FIG. 12 is a cross-sectional view of a display device according to another embodiment. In FIG. 12, since same reference numerals as those in FIG. 6A denote the same elements, repeated descriptions thereof are omitted.

Referring to FIG. 12, the display device according to the present embodiment includes the first display area DA and the second display area SA, the second display area SA including the transmissive area TA. Each of the opposite electrode 223 and the top layer 250 of the display device includes the opening area TAH corresponding to the transmissive area TA. The top layer 250 includes the convex portion 250C that neighbors the opening area TAH.

In the present embodiment, the main organic light-emitting diode OLED and the auxiliary organic light-emitting diode OLED' may be covered by an encapsulation substrate 300A. The encapsulation substrate 300A includes a transparent material. For example, the encapsulation substrate 300A may include a glass material. In some examples, the encapsulation substrate 300A may include a polymer resin. The encapsulation substrate 300A may prevent or substantially prevent external moisture or foreign substances from penetrating to the main organic light-emitting diode OLED and the auxiliary organic light-emitting diode OLED'.

A sealing material such as sealant may be arranged between the substrate 100 and the encapsulation substrate 300A, the substrate 100 including the main organic light-emitting diode OLED and the auxiliary organic light-emitting diode OLED'. The sealing material may block external moisture or foreign substances that may penetrate through a space between the substrate 100 and the encapsulation substrate 300A.

Figure 13:
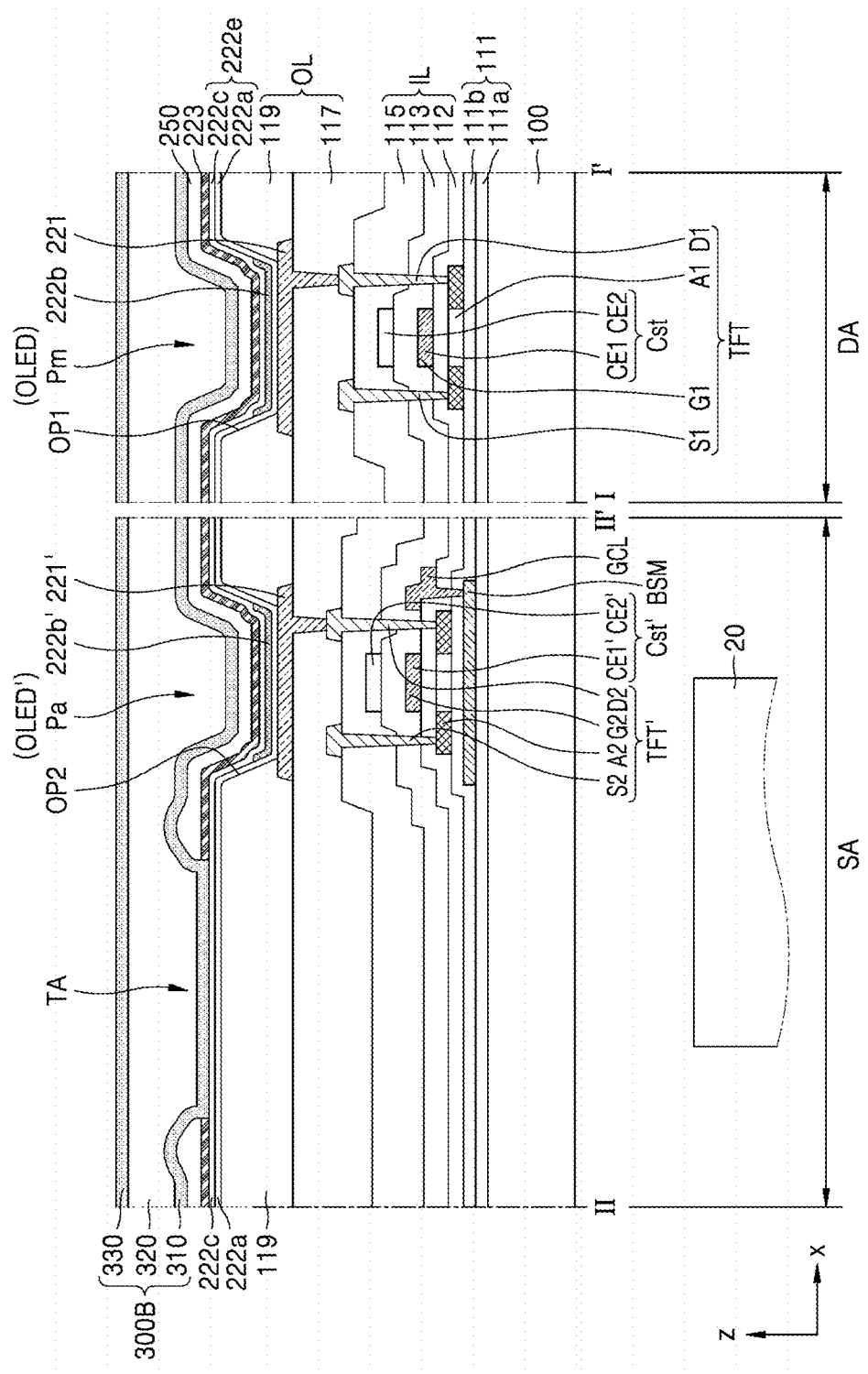
FIG. 13 is a cross-sectional view of a display device according to another example embodiment.

FIG. 13 is a cross-sectional view of a display device according to another embodiment. In FIG. 13, since same reference numerals as those in FIG. 6A denote the same elements, repeated descriptions thereof are omitted.

Referring to FIG. 13, the display device according to the present embodiment includes the first display area DA and the second display area SA, the second display area SA including the transmissive area TA. Each of the opposite electrode 223 and the top layer 250 of the display device includes the opening area TAH corresponding to the transmissive area TA. The top layer 250 includes the convex portion 250C that neighbors the opening area TAH.

In the display device according to the present embodiment, the thin-film encapsulation layer 300 is arranged on the top layer 250. The thin-film encapsulation layer 300 may include at least one inorganic encapsulation layer and at least one organic encapsulation layer. With regard to this, it is shown in FIG. 13 that the thin-film encapsulation layer 300 has a structure in which the first inorganic encapsulation layer 310, the organic encapsulation layer 320, and the second inorganic encapsulation layer 330 are stacked. In another embodiment, the number of organic encapsulation layers, the number of inorganic encapsulation layers, and a stacking sequence may be modified.

The first inorganic encapsulation layer 310 and the second inorganic encapsulation layer 330 may each include at least one inorganic insulating material including aluminum oxide, titanium oxide, tantalum oxide, hafnium oxide, zinc oxide, silicon oxide, silicon nitride, silicon oxynitride, and/or the like, and may be formed by chemical vapor deposition (CVD). The organic encapsulation layer 320 may include a polymer-based material. The polymer-based material may include a silicon-based resin, an acrylic-based resin, an epoxy-based resin, polyimide, polyethylene, and/or the like.

The first inorganic encapsulation layer 310, the organic encapsulation layer 320, and the second inorganic encapsulation layer 330 may each be formed as one body (e.g., one contiguous body) to cover the first display area DA and the second display area SA. Therefore, the first inorganic encapsulation layer 310, the organic encapsulation layer 320, and the second inorganic encapsulation layer 330 may be arranged inside the opening area TAH.

In another embodiment, the organic encapsulation layer 320 may be formed as one body (e.g., one contiguous body) to cover the first display area DA and the second display area SA, and may not be present in the transmissive area TA. In other words, the organic encapsulation layer 320 may include an opening corresponding to the transmissive area TA. In this case, the first inorganic encapsulation layer 310 and the second inorganic encapsulation layer 330 may contact each other inside the opening area TAH.

Figure 14A:
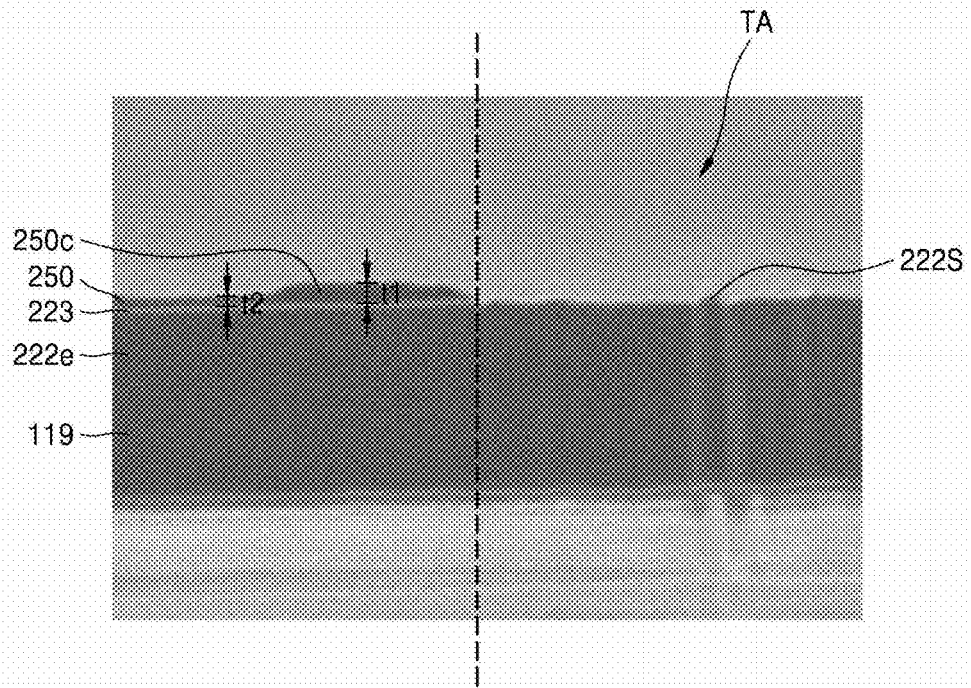
FIGS. 14A-14B are images of surroundings of a transmissive area, captured after an opposite electrode is lifted off.
Figure 14B:
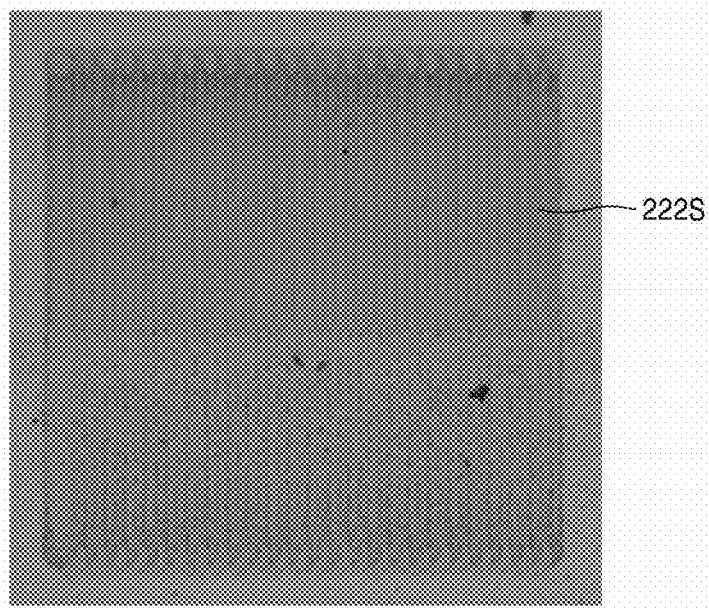

FIGS. 14A and 14B are images of surroundings of the transmissive area TA, captured after an opposite electrode is lifted off according to the present embodiments.

Referring to FIGS. 14A and 14B, the top layer 250 around the transmissive area TA includes the convex portion 250C, the convex portion 250C having a thickness t1 greater than a neighboring thickness t2 of the surroundings thereof. The organic functional layer 222e and the pixel-defining layer 119 may be arranged in the transmissive area TA, and the protrusion patterns 222S may be formed on the top surface of the organic functional layer 222e.

Referring to FIG. 14B, it is known that the protrusion patterns 222S on the top surface of the organic functional layer 222e are formed in a scanning direction of the laser light LP.

In a display device according to embodiments, since a pixel area and a transmissive area having an improved light transmittance are arranged in the second display area corresponding to a component such as a sensor, an environment under which the component may operate may be secured, and simultaneously (or concurrently), an image may be displayed in an area overlapping the component.

Therefore, a display device having various functions and simultaneously improving a quality may be provided. However, these effects are provided as an example and effects according to embodiments are described in detail through following description.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ.

Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", or "immediately adjacent" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification.

The display device and/or any other relevant devices or components according to embodiments of the present invention described herein may be implemented utilizing any suitable hardware, firmware (e.g. an application-specific integrated circuit), software, or a suitable combination of software, firmware, and hardware. For example, the various components of the display device may be formed on one integrated circuit (IC) chip or on separate IC chips. Further, the various components of the display device may be implemented on a flexible printed circuit film, a tape carrier package (TCP), a printed circuit board (PCB), or formed on a same substrate. Further, the various components of the display device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various suitable changes in form and details may be made therein without departing from the spirit and scope of the present disclosure as defined by the following claims and equivalents thereof.

What is claimed is:

1. A display device comprising:
   a substrate comprising a first display area and a second display area, the first display area comprising a first pixel, and the second display area comprising a second pixel and a transmissive area;
   a first pixel electrode and a first emission layer in the first pixel;
   a second pixel electrode and a second emission layer in the second pixel;
   an opposite electrode arranged as one body in the first display area and the second display area; and
   a top layer arranged on the opposite electrode,
   wherein the opposite electrode and the top layer each have an opening area corresponding to the transmissive area,
   wherein the top layer has a convex portion around the transmissive area, the convex portion being convex in a top surface direction of the substrate, and
   wherein the top layer has a thickness at a bulge of the convex portion that is greater than a thickness at an edge portion of the top layer that is around the opening area.

2. The display device of claim 1, further comprising:
   an organic functional layer between the first pixel electrode and the opposite electrode,
   wherein the organic functional layer corresponds to the transmissive area.

3. The display device of claim 2, wherein a plurality of protrusion patterns are on a top surface of the organic functional layer.

4. The display device of claim 3, wherein the plurality of protrusion patterns are apart from each other at set intervals, each of the plurality of protrusion patterns extending in one direction.

5. The display device of claim 1, further comprising:
   a second thin film transistor in the second display area; and
   a bottom electrode layer between the substrate and the second thin film transistor.

6. The display device of claim 1, further comprising:
   a pixel-defining layer exposing a central portion of each of the first pixel electrode and the second pixel electrode and covering edges of each of the first pixel electrode and the second pixel electrode,
   wherein the pixel-defining layer comprises a first opening corresponding to the transmissive area.

7. The display device of claim 6, further comprising:
   a planarization layer between the substrate and the pixel-defining layer,
   wherein the planarization layer comprises a second opening corresponding to the transmissive area.

8. The display device of claim 7, wherein a width of the first opening is less than a width of the second opening.

9. The display device of claim 1, further comprising:
   an inorganic insulating layer arranged on the substrate,
   wherein the inorganic insulating layer comprises a third opening corresponding to the transmissive area.

10. The display device of claim 9, wherein a width of the opening area is less than a width of the third opening.

11. The display device of claim 1, wherein the first display area and the second display area are sealed by an encapsulation substrate facing the substrate.

12. The display device of claim 1, further comprising:
    a thin-film encapsulation layer comprising a first inorganic encapsulation layer, an organic encapsulation layer, and a second inorganic encapsulation layer that are sequentially stacked on the top layer.

13. A display device comprising:
    a substrate comprising a pixel and a transmissive area, the pixel comprising a display element;
    a pixel electrode and an emission layer in the pixel;

an opposite electrode on the emission layer; and
a top layer on the opposite electrode,
wherein the opposite electrode and the top layer each have an opening corresponding to the transmissive area, and
wherein the top layer comprises a convex portion, the convex portion neighboring the transmissive area and being thicker than a thickness of surroundings thereof.

14. The display device of claim 13, further comprising:
an organic functional layer between the pixel electrode and the opposite electrode,
wherein the organic functional layer corresponds to the transmissive area.

15. The display device of claim 14, wherein a plurality of protrusion patterns are on a top surface of the organic functional layer.

* * * * *